United States Patent
Rogers et al.

(10) Patent No.: US 10,222,123 B2
(45) Date of Patent: Mar. 5, 2019

(54) SYSTEM FOR HEAT TREATING A SAPPHIRE COMPONENT

(71) Applicant: APPLE INC., Cupertino, CA (US)

(72) Inventors: Matthew S. Rogers, Cupertino, CA (US); Christopher D. Jones, Cupertino, CA (US); Dale N. Memering, Cupertino, CA (US); Alexander M. Hoffman, Cupertino, CA (US); Ping Chung Chen, Cupertino, CA (US); Chien-Wei Huang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 383 days.

(21) Appl. No.: 14/744,893

(22) Filed: Jun. 19, 2015

(65) Prior Publication Data
US 2016/0368808 A1    Dec. 22, 2016

(51) Int. Cl.
*F27B 17/00* (2006.01)
*C30B 29/20* (2006.01)
*C30B 33/02* (2006.01)
*F27D 5/00* (2006.01)

(52) U.S. Cl.
CPC .......... *F27B 17/0016* (2013.01); *C30B 29/20* (2013.01); *C30B 33/02* (2013.01); *F27D 5/0006* (2013.01); *F27D 5/005* (2013.01); *F27D 5/0056* (2013.01)

(58) Field of Classification Search
CPC ........ F27B 1/04; F27B 17/0016; C03B 33/02; F27D 5/0006; F27D 5/0056; F27D 5/005
USPC ............ 432/5, 120, 153, 253, 258, 259, 260
See application file for complete search history.

(56) References Cited

U.S. PATENT DOCUMENTS

| | | | | |
|---|---|---|---|---|
| 4,966,549 A | * | 10/1990 | Ohdate | C30B 25/12 118/500 |
| 5,667,603 A | * | 9/1997 | Ichikawa | C21D 9/0037 148/581 |
| 6,401,941 B1 | * | 6/2002 | Maumus | F27D 3/12 148/586 |
| 6,420,678 B1 | * | 7/2002 | Hoekstra | B23K 26/0057 219/121.67 |
| 6,683,004 B1 | * | 1/2004 | Inoue | H01L 21/76224 216/38 |

(Continued)

FOREIGN PATENT DOCUMENTS

CN    204174314 U * 2/2015
WO    WO 2014/069784 A1 * 5/2014

*Primary Examiner* — Steven B McAllister
*Assistant Examiner* — Benjamin W Johnson
(74) *Attorney, Agent, or Firm* — Dorsey & Whitney LLP

(57) ABSTRACT

A system for heat treating sapphire components to increase strength while maintaining the optical finish and/or transparency of the component. The system may include a fixture positioned in a furnace and configured to suspend an array or group of sapphire components. The fixture may include notches or other features to assist in locating and positioning the sapphire components. Shield elements or enclosures may also be interspersed with the sapphire components and may help produce a more uniform heat distribution and protect the sapphire components from emissions or deposits. Some aspects are directed to a sleeve tool and fixture jig that can be used to assemble the sapphire components onto the fixture in a way that reduces the risk of marring or otherwise damaging the sapphire components.

4 Claims, 14 Drawing Sheets

(56) References Cited

U.S. PATENT DOCUMENTS

2015/0267321 A1\* 9/2015 Lee .................. C30B 29/20
432/18

\* cited by examiner

SYSTEM FOR HEAT TREATING A SAPPHIRE COMPONENT

FIELD

This disclosure generally relates to systems for manufacturing ceramics and, more specifically, to a furnace system and fixtures for heat treating sapphire components.

BACKGROUND

Sapphire or corundum is a crystalline form of aluminum oxide and may be found or made in a variety of different colors and shapes. In general, sapphire is a hard and strong material and may be capable of scratching nearly all other materials. Because of its hardness and strength, sapphire may be an attractive alternative to other translucent materials like glass or polycarbonate. However, using some traditional techniques generally makes it difficult to manufacture thin sheets of sapphire material having both a desired strength and optical quality.

SUMMARY

Embodiments described herein are generally directed to systems and methods of heat treating a sapphire component that can be used for a protective cover of an electronic device. The techniques described herein may be used to produce a sapphire component that has improved strength while maintaining the optical finish and/or transparency of the component.

Some example embodiments are directed to a system for heat treating a sapphire component. The system may include a furnace that defines an internal volume. A trunk member may be disposed within the internal volume of the furnace. A rod may extend from the trunk member and be configured to suspend a group of sapphire components by an opening formed in each of the sapphire components. The system may also include a vacuum supply configured to remove gas from the internal volume of the furnace and a gas supply configured to introduce an inert gas to the internal volume of the furnace.

In some embodiments, the trunk member is oriented in an upright position and the rod extends laterally from the trunk member. Multiple shield elements may be suspended from the rod. At least one shield element of the multiple shield elements may be positioned between adjacent sapphire components. Multiple shield enclosures may be suspended from the rod, and each shield enclosure may at least partially enclose a respective sapphire component. The rod and the multiple shield enclosures may be formed from sapphire.

In some embodiments, the rod includes a series of notches formed along a length of the rod. Each notch of the series of notches may be configured to maintain a position and orientation of a respective sapphire component. The respective sapphire component may include a beveled edge formed around the opening of the sapphire component. A depth of a notch of the series of notches may be approximately equal to a height of the beveled edge.

In some embodiments, the rod has a round cross-section and may be configured to contact an edge of the opening of the sapphire component at a single location. In some embodiments, the rod is faceted and is configured to contact an edge of the opening of the sapphire component at two or more locations.

Some example embodiments are directed to a system for heat treating a sapphire component. The system may include a furnace that defines an internal volume. A fixture may be positioned within the internal volume and configured to suspend multiple sapphire components within the furnace. The system may also include a vacuum supply that is operatively coupled to the internal volume and configured to remove gas from the internal volume of the furnace and a gas supply operatively coupled to the internal volume and configured to introduce an inert gas to the internal volume of the furnace. The system may also include multiple heating elements that are formed from a refractory metal.

In some embodiments, the sapphire component is a cover sheet that is configured to be installed over a display of an electronic device. In some embodiments, the sapphire component is a cover sheet that is configured to be installed on an external surface of an enclosure of an electronic device.

In some embodiments, a sleeve tool may be used to place the sapphire components on the rod. The sleeve tool may include an outer surface defining a bore therethrough. The rod may be received within the bore of the sleeve tool, and the sleeve tool may be inserted through the openings of the multiple sapphire components. A fixture jig having a series of slot features may be used to position the sapphire components. Each slot feature may be configured to hold upright a respective sapphire component of the multiple sapphire components. The fixture jig may be configured to maintain alignment of the openings of the multiple sapphire components during an insertion of the sleeve tool.

Some example embodiments are directed to a method of assembling a group of sapphire components onto a rod of a fixture. The group of sapphire components may be inserted into a series of slot features formed in a fixture jig. Each slot feature may hold a corresponding sapphire component upright. A sleeve tool may be inserted through an opening formed in each sapphire component. A rod may be inserted into the sleeve tool. The sleeve tool may be removed from the rod while maintaining a position of the group of sapphire components fixed with respect to the rod. In some cases, the fixture jig maintains the position of the group of sapphire components with respect to the rod while the sleeve tool is being removed from the rod. The method may also include installing a group of shields on the fixture jig, inserting the sleeve tool through an opening formed in each shield, and removing the sleeve tool from the rod while maintaining a position of the group of shields fixed with respect to the rod. In some embodiments, the rod includes a series of notches arranged down a length of the rod. Each sapphire component may be placed in a corresponding notch of the rod as the sleeve tool is removed from the rod.

In some example embodiments, the group of sapphire components and the rod are placed in an internal volume of a furnace. Gas may be removed from the internal volume of the furnace by applying a vacuum. An inert gas may be added or introduced to the internal volume of the furnace. The internal volume of the furnace may be heated to a threshold temperature. The threshold temperature may be maintained for a duration to increase the strength of at least one sapphire component of the multiple sapphire components.

DETAILED DESCRIPTION

Figure 1A:
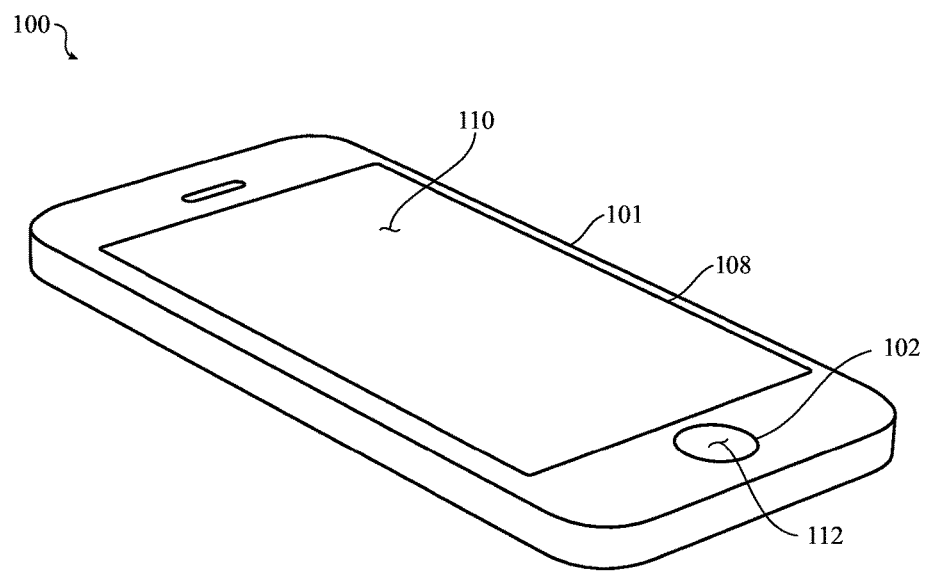
FIG. 1A depicts a top view of an example electronic device.

Modern day consumer electronic devices and consumer devices in general may be subjected to frequent use in a variety of environments. The exterior surfaces of the device may be used to protect the delicate internal components of the device and maintain a high-quality and scratch-free appearance despite frequent and repeated contact with hard objects, such as keys, coins, and other objects likely to be in proximity to the device. Additionally, it may be advantageous that the exterior surfaces maintain optical clarity for viewing an integrated display or providing an optically transparent window for a camera, optical sensor, or other optical elements integrated with the device.

In general, it may be advantageous for a consumer or non-consumer device to include protective coverings, windows, and/or surfaces formed from a hard material, such as sapphire. Compared to other optically clear materials like traditional silicate glass, sapphire may offer improved scratch resistance and strength. However, thin sheets of optically clear sapphire may be difficult to manufacture using traditional techniques. In particular, it may be challenging to produce a sapphire component that has both the strength to withstand repeated contact with external objects and a high degree of optical clarity required for some applications. As discussed herein, in accordance with various embodiments, sapphire components can be manufactured using various heat-treating techniques that may be adapted to produce a sapphire component that satisfies both strength and optical criteria. The heat-treating techniques may also use a variety of fixtures and component handling techniques that may facilitate processing while reducing or minimizing defects in the finished sapphire components.

In some embodiments, the sapphire component may be positioned in a furnace or similar type of heating apparatus capable of performing one or more heat-treating operations for annealing or strengthening the component. In some cases, the heat treating reduces the number or degree of micro-fractures, cracks, or other discontinuities in the sapphire component, which may grow over time and reduce the strength and/or reliability of the component if subjected to repeated stress or contact. The micro-fractures or cracks may also cause the sapphire component to shatter under stress, such as an impact or blow. While some annealing processes may strengthen the part, they may also produce optical flaws or artifacts that may be undesirable or unacceptable in the finished product. For example, some annealing processes may produce a whitish haze and/or dots on the surface of the component that may be difficult to remove even if the part is subjected to post-annealing polishing operations. Additionally, subjecting the component to polishing or surface treatment operations after the annealing process may re-introduce micro-fractures or cracks, which can weaken the component. Also, some annealing processes may create internal slip lines or discontinuities due to internal stresses in the material due to the heating process. The techniques and fixtures described herein may be used to reduce or eliminate these potentially undesirable artifacts.

The present disclosure is directed to a system for heat treating sapphire components to improve strength while maintaining the optical finish and/or transparency of the component. The system may include a fixture positioned in a furnace and configured to suspend an array or group of sapphire components. The fixture may include notches or other features to assist in locating and positioning the sapphire components. Shield elements or enclosures may also be interspersed with the sapphire components and may help produce a more uniform heat distribution and protect the sapphire components from emissions or deposits. Some aspects of the disclosure are directed to a sleeve tool and fixture jig that can be used to assemble the sapphire components onto the fixture in a way that reduces the risk of marring or otherwise damaging the sapphire components.

Multiple sapphire components may be positioned within a furnace to maximize the yield or processing throughput of the furnace. As described in more detail herein, a fixture having multiple horizontal rods may be used to maximize use of the internal volume of the furnace. The horizontal rods may be formed from a sapphire material to reduce thermal gradients, which may lead to defects or undesirable artifacts in the sapphire components. The rods may include one or more features, such as notches or a profiled shape, which may help maintain the position of the components within the furnace and also reduce or minimize the impact of the fixture on the finish and/or strength of the heat-treated sapphire component.

A shield element or shield enclosure (generally referred to as a shield) may be used to reduce chances of contamination by debris or various deposits that may affect the surface finish of the heat-treated sapphire components. A shield may also increase the uniformity of the heat and may reduce the internal thermal stresses in the sapphire component being treated. In some cases, the shield may at least partially enclose a sapphire component. The shield may be open on one or more sides to facilitate heat exchange and/or installation of the shield in the furnace. A tooling jig or fixture is used to load a large number of sapphire components onto the fixture rods in a way that minimizes or reduces the chance of scraping or damage. The tooling jig may also accommodate or facilitate the installation of the shields with the sapphire components within the internal volume of the furnace.

The heat-treating process is formulated to reduce or minimize particular optical artifact(s), increase strength of components, and/or reduce the need for post-heat-treatment surface polishing. As described in more detail herein, a heat-treating process may include filling the furnace with an inert gas prior to performing a heat-treating operation. In some cases, the furnace may be substantially evacuated before filling with an inert gas. In some embodiments, the sapphire components are subjected to a multiple stage heating process to reduce internal stresses on the part and/or improve the optical quality of the heat-treated sapphire component. The threshold temperature and the dwell time at one or more different threshold temperatures may be tailored to the sapphire components and the furnace system to produce certain results.

In some embodiments, the sapphire components are subjected to a specialized cleaning process prior to being heat treated, which may also improve the optical properties of the sapphire component. The cleaning process includes an all-wet staged cleaning process that includes multiple ultrasonic cleaning stages. Each stage of the cleaning process may be configured to remove a particular size of particle or type of surface debris and may include one or more liquid immersions. By maintaining the surface wetness of the sapphire component during cleaning, the chances of surface contamination or dried debris deposits are reduced. The cleaning operation may also be paired with a surface treatment that produces a polished surface that is highly aligned with the crystallographic structure of the sapphire components. As described in more detail herein, these types of pre-treatments may be used to produce a sapphire component that meets certain strength and optical criteria.

The systems and techniques described herein can be used to facilitate a heat-treating operation or process used to manufacture a sapphire component or part. While the following examples are provided with respect to a furnace-based heat-treating operation, similar techniques may be applied using a variety of heat-treating equipment. For example, a wide variety of heating elements may be used in combination with various heat-containing structures to subject the sapphire components to the desired heating conditions. Many examples provided below may not be limited to use with a furnace-based process and may have an application to a variety of heat-treating equipment or processes.

Similarly, while specific examples are provided with respect to a sapphire component used as a cover for a portable electronic device, the techniques described herein may be used to produce a sapphire component having a wide variety of geometries and features. Additionally, the sapphire components may be used in a broad range of consumer or non-consumer products, including industrial applications. While the following examples are also provided with respect to a sapphire component, the systems and techniques may also be applicable to other ceramic components (whether single crystal, amorphous, or of other composition). The embodiments, systems, and techniques described herein are provided by way of example and are not intended to be limiting.

Figure 1B:
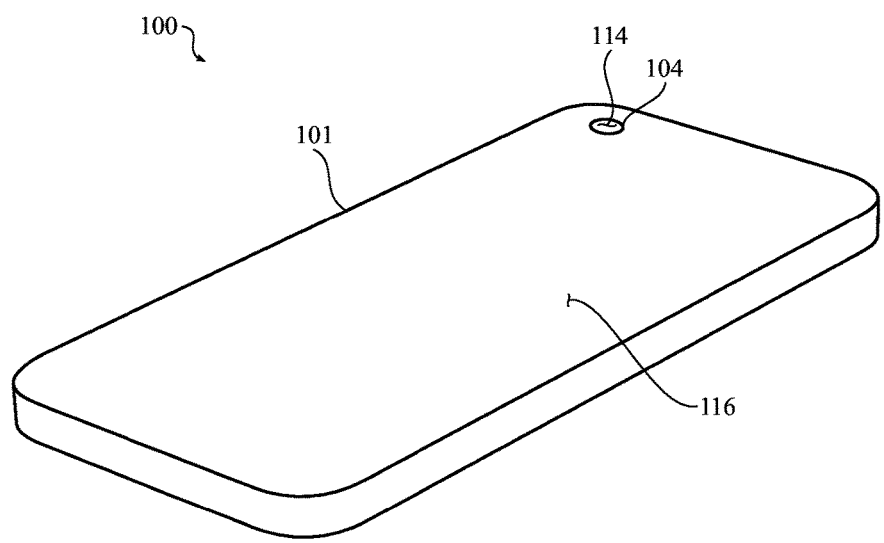
FIG. 1B depicts a bottom view of the example electronic device of FIG. 1A.

FIGS. 1A-B depict a device 100 having multiple hard protective sheets that form the exterior of the device 100. One or more of the protective sheets may be formed from a sapphire component, which may provide outstanding scratch resistance and enhance the mechanical integrity of the device. A protective sheet may also function as an optically transmissive window and provide visibility to underlying visual components, such as display 108, indicator light, or graphical element. In some implementations, both the optical and mechanical properties of the protective sheets may be important to perception of quality and structural performance of the device 100. Thus, it may be advantageous to form the protective sheets from a sapphire material or sapphire component.

The embodiments described herein relate to systems and techniques that can be used to strengthen sapphire components that form the protective sheets of the device 100. In particular, the systems and techniques may be used to heat treat or anneal sapphire components in to increase the strength of the sapphire components while also maintaining acceptable optical qualities. The system and heat-treating processes described herein may be used to anneal sapphire components without requiring significant post-annealing surface treatments or surface finishing, which may reduce costs and improve yield.

As shown in FIGS. 1A-1B, the device 100 may include an enclosure 101 and a display 108 attached to or otherwise incorporated with the enclosure 101. The enclosure may be formed from one or more separate components and provides the external structural support for the various components or subsystems of the device 100. In the example depicted in FIG. 1A, the enclosure 101 defines an opening in a (top) surface of the enclosure 101. The display 108 is disposed or positioned within the opening of the enclosure 101 and may be attached directly to the enclosure 101 or to another component or components that are attached to the enclosure 101.

In some embodiments, the display 108 may include a liquid crystal display (LCD), organic light emitting diode (OLED) display, electroluminescent (EL) display, or other type of display element. Because the cover sheet 110 overlays or is disposed over the display 108, the optical clarity, surface finish, material thickness, and/or physical strength of the component may be relevant aspects of the cover sheet 110, alone or in conjunction with other such aspects.

FIG. 1A shows the device 100 with a (front) protective cover sheet 110 formed from a sapphire component and used as an optically transmissive protective layer. The cover sheet 110 is typically attached to the device 100 using an optically transmissive adhesive, pressure sensitive adhesive, or other bonding mechanism or technique. In this example, the cover sheet 110 is attached using a pressure sensitive adhesive (PSA) film. The cover sheet 110 may be attached to a surface of the display 108 or display stack and may protect the display 108 from scratches or other physical damage.

The cover sheet 110 may also cover or form part of a touch sensor that is disposed over the display 108 and is used to receive touch input from the user. For example, the cover sheet 110 may cover or form part of a transparent capacitive or resistive touch sensor formed over at least a portion of the display 108, which may be configured to detect finger or stylus touches on the surface of the cover sheet 110. In some cases, the device 100 includes a force sensor that is configured to measure a force exerted on the cover sheet 110. In some cases the device 100 may include other sensors, such as a biometric or identification sensor, that are configured to receive input on or through the cover sheet 110.

The cover sheet 110 may vary in thickness depending on the application. For example, the cover sheet 110 may be formed from a sapphire component having an overall thickness equal to or less than 1 mm. In some cases, the overall thickness is less than 0.3 mm. In one non-limiting example, the overall thickness of the cover sheet 110 is approximately 0.1 mm. The overall thickness of the cover sheet 110 may, in some cases, be less than 0.1 mm.

The cover sheet 110 may be formed from a sapphire material that includes alumina, corundum, or other forms of aluminum oxide ($Al_2O_3$). Accordingly, references to sapphire or a sapphire material may incorporate or encompass one or more forms of aluminum oxide. As described in more detail below, the cover sheet 110 may be heat treated to provide the desired strength and optical properties. The cover sheet 110 may be formed from a single sheet of sapphire material or, alternatively, be formed from a laminate material made from multiple layers and having at least one layer formed from a sheet of sapphire. The laminate material may also include one or more additional sapphire sheets, a glass sheet, a polymer sheet, or other type of sheet material. The cover sheet 110 may also include one or more coatings, such as an oleophobic, anti-reflective, ultra-violet filter, light-polarizing, or other type of coating.

In the present example, one side of the cover sheet 110 is printed with a solid, opaque border around a perimeter portion. The center portion of the cover sheet 110 remains optically transmissive. In some embodiments, the printed side of the cover sheet 110 is the side that is opposite the external face of the device 100, which may help to prevent the printed portion from becoming scratched or damaged during use.

As shown in FIG. 1A, the front surface of the device 100 also includes a button sheet 112 used to protect the surface of the control button 102. The button sheet 112 may be positioned within a hole or opening formed in the cover sheet 110. In this example, the button sheet 112 is formed from a sapphire component and is used as an optically transmissive protective layer. The button sheet 112 may protect the surface of a control button 102 and may also provide visibility of a graphical element that is printed on or integrated with the control button 102. In some cases, it is not necessary that the button sheet 112 be optically transmissive. For example, the button sheet 112 may be opaque and itself printed with a graphical element or symbol. In the present example, the button sheet 112 is a flat sheet, but in other embodiments, the button sheet 112 may be formed as a contoured or curved surface.

The button sheet 112 may enhance the mechanical strength of control button 102, which is used as an input to the device 100. In the present example, the control button 102 includes a tactile switch which is operated by depressing the control button 102. The control button 102 may also include or be associated with an electronic touch sensor, such as a capacitive touch sensor or biometric sensor. The button sheet 112 may be attached directly to a housing of the control button 102 and may, alternatively be attached or integrated with the electronic touch sensor of the control button 102. Similarly, a sapphire component can be used as a protective cover for a variety of input mechanisms, including, a slide, wheel, key, and the like.

Similar to the cover sheet 110, the button sheet 112 may vary in thickness depending on the application, For example, the button sheet 112 may be formed from a sapphire component having an overall thickness equal to or less than 1 mm. In some embodiments, the overall thickness of the button sheet 112 is less than 0.3 mm. The overall thickness may be equal to or less than 0.1 mm. Similar to the cover sheet 110, the button sheet 112 may be formed from a single sheet of sapphire material or, alternatively, be formed from a laminate material having at least one layer formed from a sheet of sapphire. In some cases, the button sheet 112 is formed from the same material as the cover sheet 110, although this is not necessary. One or both sides of the button sheet 112 may also be printed or coated to enhance the optical properties of the sapphire component.

As shown in FIG. 1B, the back surface of the device 100 is protected by a back sheet 116. Similar to the cover sheet 110, the back sheet 116 may also be formed from a sapphire component and used as an optically transparent protective layer. In this case, the back sheet 116 provides visibility of graphical elements printed on the back face of the device 100. Also similar to the cover sheet 110, the back sheet 116 may be formed from a single sheet of sapphire material or may be formed from a laminate material having at least one layer formed from a sheet of sapphire. The back sheet 116 covers the entire back of the device 100, except for the area near the camera 104. A separate sapphire component 114 may be used to protect the camera 104. In an alternative embodiment, the back sheet 116 also covers the camera 104 and a separate sapphire component 114 is not used.

As shown in FIGS. 1A-B, the device 100 is a portable electronic device, specifically a mobile telephone. However, the device 100 may include any one of a variety of devices that utilizes a hard substrate as a covering, window, and/or other component. For example, the device 100 may be a portable media player, a navigational device, a portable computing device, or other portable electronic appliance. Similar types of protective covers may be applied to other electronic devices, including, for example, tablet computers, notebook computers, and so on. Furthermore, a protective cover, similar to those described above, may be integrated with any device that includes a hard exterior surface, particularly if the surface includes a display screen, camera, or other optical element.

Figure 2:
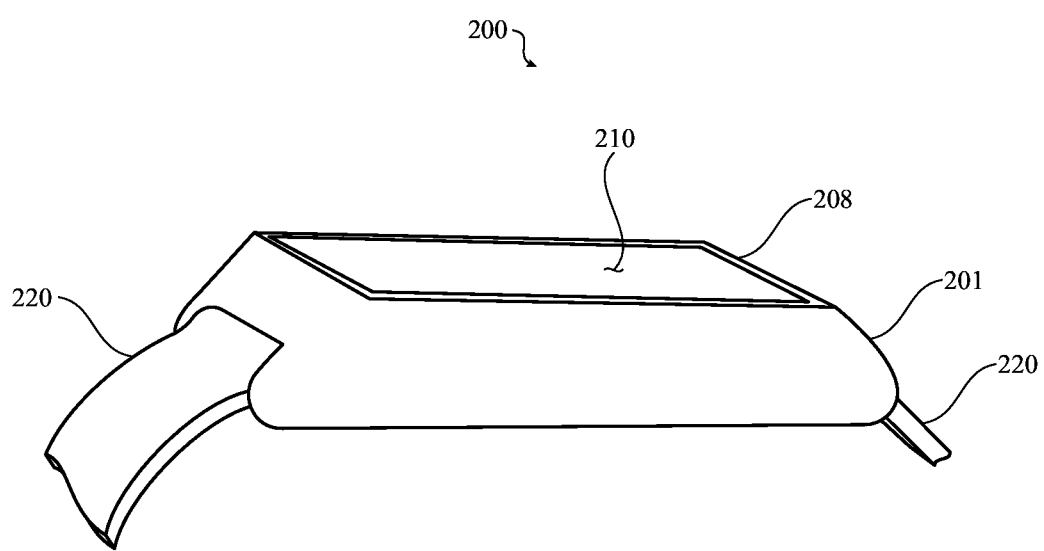
FIG. 2 depicts another example electronic device.

FIG. 2 depicts another example device 200 that includes a sapphire component. In particular, the device 200 is a wearable consumer product that includes a cover 210 formed from a sapphire component. In some embodiments, the device 200 is a wearable device, wearable electronic device, health monitoring device, and/or other wearable consumer product. The device 200 may also include non-electronic devices, such as a mechanical watch or other wearable product that include a cover or component formed from a sapphire component.

Similar to the example covers described above with respect to FIGS. 1A-B, the cover 210 of FIG. 2 may be formed from a sapphire material, which may include various forms of aluminum oxide. Also similar to the previously described examples, the cover 210 may provide both structural or mechanical protection for the device 200, as well as optical clarity for viewing the display 208 or other visual element of the device 200. As described in more detail below, the cover 210 may be heat treated to provide the desired strength and optical properties.

As shown in FIG. 2, the device 200 includes a body 201 having an opening. The display 208 is positioned or disposed within the opening, and the cover 210 is positioned or disposed over the display 208. Similar to the previous example, the display 208 may include a liquid crystal display (LCD), organic light emitting diode (OLED) display, electroluminescent (EL) display, or other type of display element. Because the cover 210 overlays or is disposed over the display 208, the optical clarity, surface finish, material thickness, and/or physical strength of the component may be relevant aspects of the cover 210, alone or in conjunction with other such aspects. The cover 210 may also be attached to, or be integrated with, a transparent electronic sensor that overlays the display 208. In some cases, the electronic sensor covers the entire display 208 and serves as the main input for the device 200.

As shown in FIG. 2, the device 200 may also include an attachment component 220. The attachment component 220 may include a band or strap formed from a variety of materials, including cloth, synthetic fiber, polymer, metal, leather, and so on. The attachment component 220 may be configured to attach the device 200 to a body part of a user, such as the user's wrist or portion of the user's arm. In some embodiments, the attachment component 220 may also include a sapphire component used to protect one or more exterior surfaces.

As described above with respect to FIGS. 1A-B and 2, a sapphire component may be used as both a structural and/or optical element of the device. Also, as described above a sapphire component may be subjected to one or more heat treatments to increase the strength of the part and/or reduce defects formed into the sapphire material. The systems and techniques described below with respect to FIGS. 4-12 may be used to produce any of the sapphire components described above with respect to the example devices of FIGS. 1A-B and 2.

Figure 3:
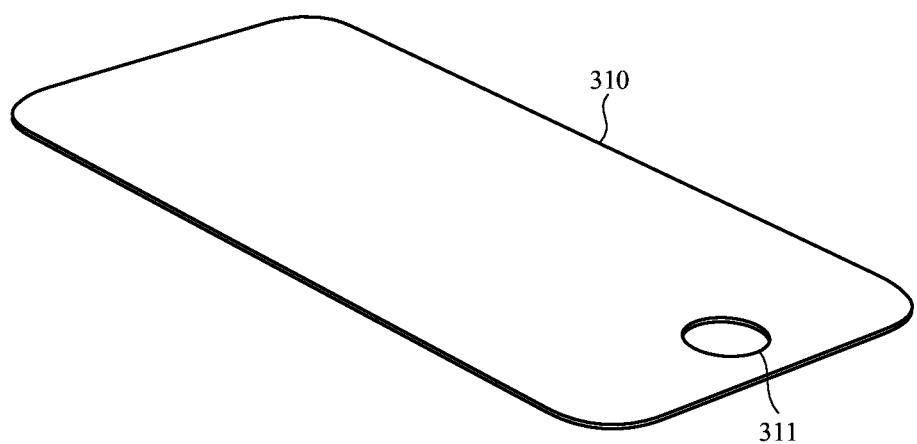
FIG. 3 depicts an example ceramic component suitable for use with the example electronic device of FIGS. 1A-B.

FIG. 3 depicts an example sapphire component 310 which may be subjected to the heat treating and/or processing operations described herein. To simplify the following description, repeated reference is made to the example sapphire component 310 depicted in FIG. 3, which may correspond in geometry and other aspects to the front cover sheet 110 described above with respect to FIG. 1A. While the sapphire component 310 is provided as one example, the systems and techniques described below may also be used to heat treat or otherwise process other example covers described above (e.g., 110, 112, 116, 114, 210) as well as other sapphire-based components. Also, while the opening 311 of sapphire component 310 is utilized in some of the fixturing examples described below, another feature of an analogous alternative sapphire component may be used in a similar fashion in accordance with the embodiments described herein.

Figure 4:
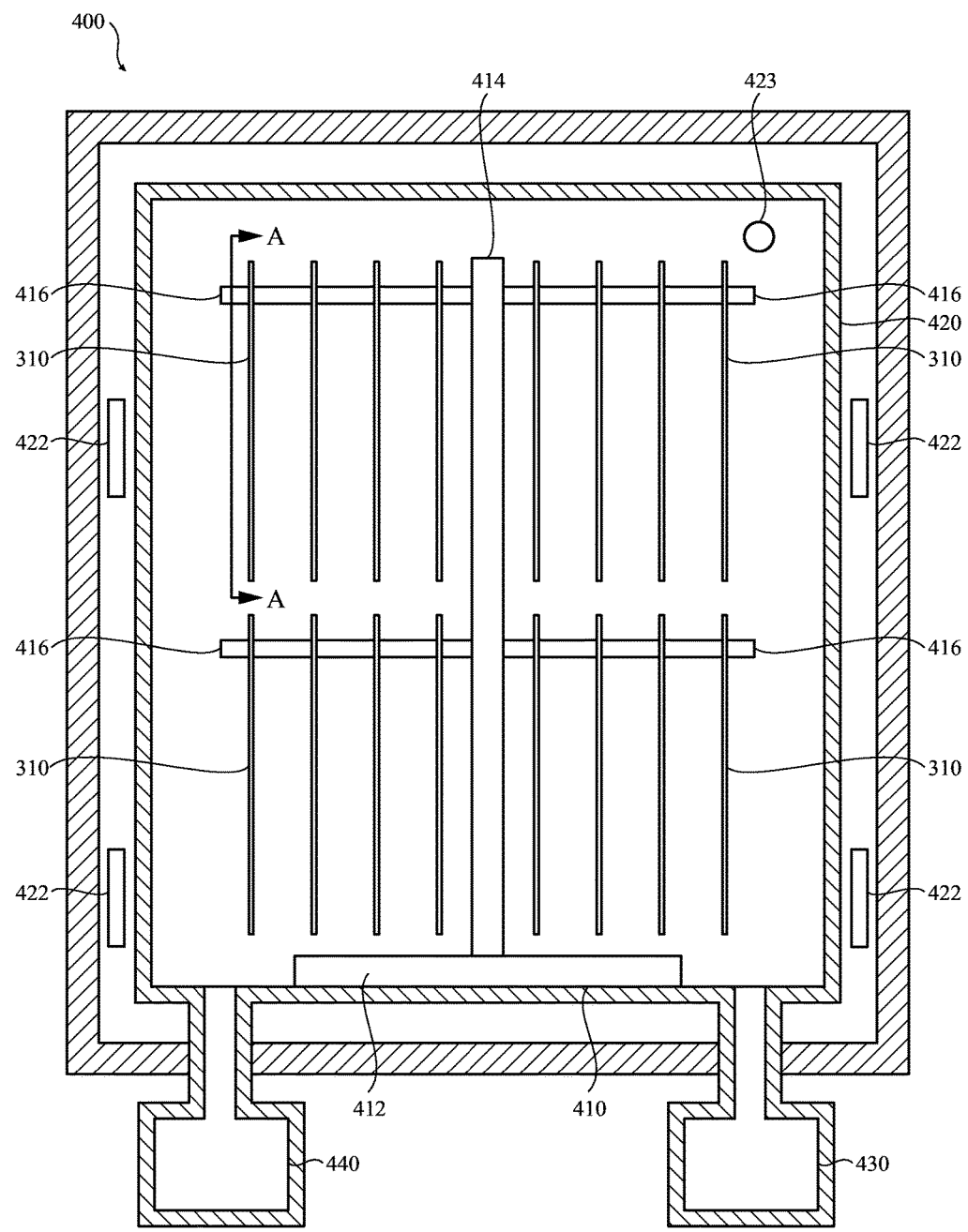
FIG. 4 depicts a cross-sectional view of an example system for heat treating a sapphire component.

FIG. 4 depicts an example system 400 for heat treating a sapphire component 310 in accordance with some embodiments. The system 400 may be used to perform one or more of the heat-treating operations described herein and more specifically the processes described below with respect to FIGS. 9-11. The system 400 includes a furnace 420 having an internal volume that may be heated in accordance with one or more embodiments. A fixture 410 may be positioned or disposed within the internal volume of the furnace 420, which may be used to suspend or position multiple sapphire components 310.

The furnace 420 may include an enclosure formed by multiple walls which define the internal volume of the furnace. Each of the walls may be formed from a material capable of withstanding sustained high temperature operating conditions and may also be insulated to reduce heat loss and/or produce a substantially even distribution of heat, including, for example a combination of ceramic sheet and ceramic fiber materials. One or more of the walls may be include a door or hatch that facilitates access to the internal volume for placing sapphire components 310 and/or the fixture 410 into the internal volume. While the example depicted in FIG. 4 is a rectangular-shaped furnace, other configurations including a cylindrical- or spherical-shaped furnace could also be used.

The furnace 420 may include one or more heating elements 422 that are configured to elevate the temperature of the internal volume to temperatures of 2100 degrees Celsius or higher. The heating elements 422 may be integrated with or incorporated into the walls of the furnace 420 or may be positioned within the internal volume of the furnace 420. The heating elements 422 may include a carbon-based heating element, a tungsten-based heating element, a molybdenum-based heating element, and so on. In some cases, a refractory metal (e.g., tungsten) heating element is used to improve the optical quality of the sapphire component 310 by reducing etching or damaging of the sapphire component 310, as some refractory metals emit fewer particles when heated to high temperatures.

In some embodiments, the heating elements 422 may also be positioned relative to the sapphire components 310 in a way to reduce potential contamination due to emissions produced by the heating elements 422. In some implementations, a minimum distance is maintained between the heating elements 422 and the sapphire components 310. For example, a minimum distance of 10-20 mm or greater may be maintained between the heating elements 422 and the sapphire components 310. The relative position of the sapphire components 310 with respect to the heating elements 422 may also reduce the potential for emission exposure. For example, the sapphire components 310 may be positioned so that the lowest surface area is facing the nearest heating element 422.

The furnace 420 may include one or more temperature sensors 423 operatively coupled to a furnace controller that is configured to adjust the temperature of the internal volume and/or maintain a set point or threshold temperature within the internal volume. In general, the temperature sensor 423 may provide temperature feedback and/or temperature monitoring functionality. The temperature sensor 423 may include one or more of a thermocouple, thermistor, or other similar temperature-sensitive device.

Still in reference to FIG. 4, a fixture 410 is positioned or disposed within the interior volume of the furnace 420. In the present example, the fixture 410 includes a trunk member 414 also positioned or disposed within the internal volume of the furnace 420. The trunk member 414 may be attached to one of the walls of the furnace 420 and/or may be supported by a base structure 412 positioned on a lower wall (or floor) of the furnace 420. The trunk member 414 may be oriented in an upright position or otherwise disposed generally in the vertical direction, although it is not necessary that the trunk member 414 be perfectly vertical. In some cases, the fixture 410 may include multiple trunk members 414, which may be positioned at opposing angles to form an a-frame or other supporting structure.

Multiple rods 416 may extend from the trunk member 414. In the present example, each rod 416 extends laterally from the trunk member 414 in a generally horizontal direction. The rod 416 may also be described as extending outwardly from the trunk member 414. While the rods 416 generally extend in a horizontal direction, it is not necessary that the rods 416 be perfectly horizontal or that the rods 416 be perpendicular to the trunk member 414. The rods 416 may be formed from a material that is capable of withstanding sustained high-temperature conditions produced by the furnace 420. In some cases, the rods 416 may be able to withstand temperatures in excess of 2100 degrees Celsius for sustained periods of time, such as several hours. The rods 416 may be formed from a sapphire material, a tungsten material, a molybdenum material, and/or other heat-tolerant materials or alloys.

As shown in FIG. 4, multiple sapphire components 310 may be suspended or otherwise positioned within the internal volume of the furnace 420 using the fixture 410. In some embodiments, each sapphire component 310 may include an opening (e.g., 311 depicted in FIG. 3) that is used to suspend each sapphire component 310 from a respective rod 416. The rods 416 may be formed from one of a variety of profile shapes that may facilitate the heat-treating operations. Example profile shapes of the rods 416 are described in more detail below with respect to FIGS. 5A-5C. The rods 416 may also include one or more surface features, including depressions, grooves, or notches, which may also position each sapphire component 310 on the rod and within the furnace 420. Example notches are described in more detail below with respect to FIGS. 6A-6D.

The system 400 of FIG. 4 may also include a vacuum supply 430 for removing gas or evacuating the interior volume of the furnace 420 by applying a vacuum to the internal volume. The vacuum supply 430 may be operatively coupled to the interior volume of the furnace 420 via one or more ports or other fluidic couplings. The vacuum supply 430 may include one or more vacuum pumps configured to apply between 380 and 500 mm Hg to the internal volume of the furnace 420. In some embodiments, the vacuum supply may be able to apply between 500 mm and 630 mm Hg to the internal volume. In some embodiments, the vacuum supply may be able to apply 630 mm Hg or greater to the internal volume of the furnace 420.

The system 400 may also include a gas supply 440 that is connected to the internal volume of the furnace 420 via one or more ports or other fluidic couplings. The gas supply 440 may be configured to provide or introduce a supply of gas to the internal volume of the furnace 420. The gas supply 440 may include a gas reservoir or tank and a pump or other device used to transport the gas from the reservoir to the interior volume of the furnace 420. The inert gas may have been filtered (e.g., drawn from a cleanroom environment) to reduce particulate contamination. The gas supply 440 may be configured to provide the inert gas at a pressure that is greater than the air pressure of the internal volume of the furnace 420. A variety of types of inert gases, combinations, and/or compounds of inert gases may be provided using the gas supply 440, including, for example, helium, neon, argon, krypton, xenon, and so on.

The system 400 may also include other components omitted from FIG. 4 for clarity. In some embodiments, the system 400 may include one or more shield elements or shield enclosures interspersed with the sapphire components 310. The shield elements or enclosures may facilitate even heat distribution within the internal volume of the furnace 420 and may also protect the sapphire components 310 from contaminants or deposits that may be formed as a result of a heat-treating operation. A more detailed description of example shield enclosures and shield elements is provided below with respect to FIGS. 7A and 7B.

The system 400 of FIG. 4 may be used to perform one or more heat-treating processes on the sapphire components 310 including, for example, a vacuum-based heat-treating process. The heat-treating process may include evacuating the internal volume of the furnace by applying a vacuum. With reference to FIG. 4, the vacuum supply 430 may be used to remove gas or evacuate the internal volume of the furnace 420, which may have been previously filled with an atmospheric composition of gases, including nitrogen, oxygen, and other gases. The heat-treating process may also include adding or introducing an inert gas to the internal volume of the furnace 420 using, for example, the gas supply 440. In some implementations, an inert gas or gases, such as argon, may be provided to the internal volume of the furnace 420 at a near atmospheric pressure.

The heat-treating process may include heating the internal volume of the furnace 420 to a first threshold temperature using, for example, the heating elements 422. The heating of the furnace 420 may be performed while the internal volume of the furnace 420 is substantially filled with an inert gas. In some implementations, the heating elements 422 and a temperature sensor 423 are operatively coupled to a controller that is configured to maintain the threshold temperature within a tolerance or acceptable range, and over a predetermined duration. In some embodiments, the heat-treating process may include heating the internal volume of the furnace 420 to multiple threshold temperatures and maintaining each threshold temperature for a particular duration. A description of an example heat-treating process is provided below with respect to FIGS. 10 and 11.

The system 400 may be used to heat treat a sapphire component 310 to increase the strength of the part while maintaining an optically clear and/or optically uniform part. The sapphire components 310 may be subjected to one or more polishing and/or cleaning operations before being heat treated using the system 400. By pre-polishing and pre-cleaning the sapphire components 310, the resulting parts may exhibit high strength and have a high-quality optical clarity and/or surface finish without having to perform additional post-heat-treating polishing or cleaning operations. This may be advantageous because post-heat-treating polishing or cleaning operations may introduce microcracks or other material discontinuities that may reduce the strength and/or fatigue life of the sapphire component 310. Additionally, by applying a vacuum and supplying an inert gas prior to performing heat-treating operations, the strength and/or the optical properties of the sapphire component 310 may be superior as compared to sapphire produced by other techniques. The techniques and processes described herein may yield, for example, a reduction in the number of contaminants in the furnace and/or a reduction in the volume of reactive gases in the furnace.

As previously mentioned, the system 400 may also include a fixture 410, which may also facilitate heat treating sapphire components 310 to have both high strength and superior optical properties. In particular, the fixture 410 may reduce or eliminate contact between the multiple sapphire components 310 positioned within the interior volume of the furnace 420. The fixture 410 may also help maximize the utilization of space within the internal volume, which may improve production throughput. The fixture 410 may also provide uniform spacing between the sapphire components 310, which may improve the consistency or uniformity of a heat-treating process. The fixture 410 may also facilitate use of a shield element or shield enclosure, which may provide uniform thermal conditions during a given heat-treating process. A more detailed description of a shield element or shield enclosure integrated with a fixture 410 is described in more detail with respect to FIGS. 7A-7B, below.

FIGS. 5A-5D depict cross-sectional views of example rod profile shapes taken along section A-A of FIG. 4. Any of the example rods (516, 517, 518, 519) described with respect to FIGS. 5A-5D may correspond to the example rod 416 described above with respect to FIG. 4. More specifically, the example rod 416 of FIG. 4 may include one of the profile shapes depicted in FIGS. 5A-5D, which are provided as non-limiting examples of the various profile shapes that may be used.

The rods 416 may, in some instances, have a profile shape that is configured to improve the strength and/or optical properties of the sapphire components. In particular, the rods 416 may have a profile shape that is configured to contact the opening of the sapphire component 310 in a particular location or multiple locations to reduce the impact of the rod contact on the strength of key portions of the sapphire component 310.

Figure 5A:
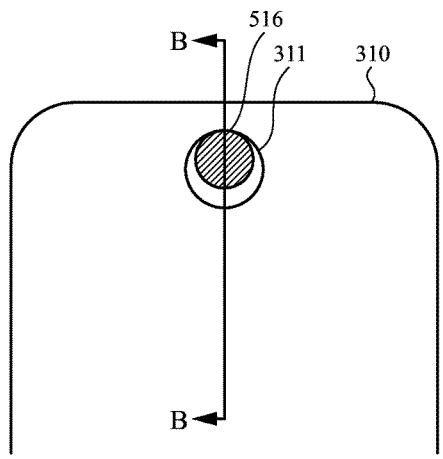
FIGS. 5A-5D depict cross-sectional views of example rod profile shapes taken along section A-A, each showing a portion of an example sapphire component hanging on the rod.

FIG. 5A depicts an example rod 516 having a round or circular profile shape. While the rod 516 is depicted as having a circular profile, the profile may be oval, elliptical, or another curved shape. Typically, the rod 516 contacts an edge of the opening 311 of the sapphire component 310 at a single location. In particular, the rod 516 is configured to contact the edge of the opening 311 at a point or location near the top of the opening 311. By contacting the sapphire component 310 at a single location, the thermal transfer between the rod 516 and the sapphire component 310 may be minimized or reduced. Likewise, the risk of damaging the finish or marring of the edge of the opening 311 may be reduced or minimized.

Figure 5B:
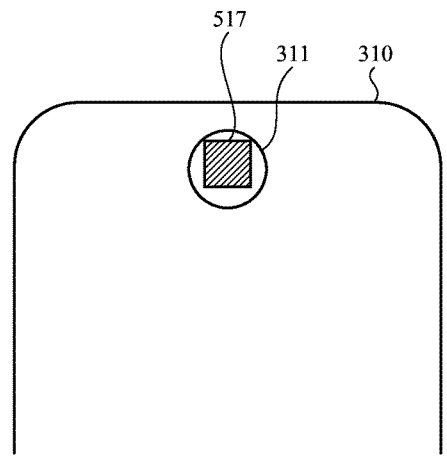
Figure 5C:
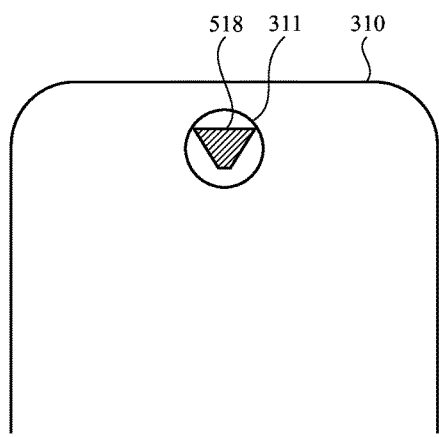
Figure 5D:
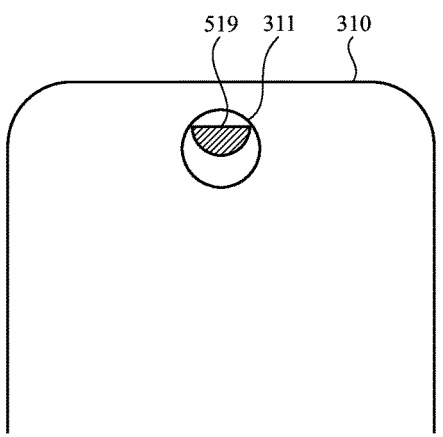

FIG. 5B depicts an example rod 517 that is faceted or having a faceted profile shape. In this particular example, the rod 517 is depicted as having a faceted profile shape that can also be described as a square-shaped profile. FIGS. 5C and 5D depict alternative rods 518 and 519 that are also faceted having different types of faceted profile shapes. In particular, FIG. 5C depicts rod 518 having a polygon or trapezoid profile shape. FIG. 5D depicts a rod 519 having a D-shaped or rounded profile shape. While FIGS. 5B-5D depict rods with different example profile shapes, they are merely illustrative and a faceted profile shape may include any one of a variety of profile geometries having at least one surface forming a faceted side.

As shown in FIG. 5B, the rod 517 is configured to contact an edge of the opening 311 of the sapphire component 310 at two locations. In particular, the rod 517 contacts the edge of the opening 311 at two points or locations along the edge opening 311, which may be symmetric. The rods 518 and 519 of FIGS. 5C and 5D are similarly configured to contact the edge of the opening 311 of the sapphire component 310 at two points or locations along the edge of the opening 311. By contacting the sapphire component 310 at two locations, contact may be avoided between the rod 517, 518, 519 and the sapphire component 310 at a location that may correspond to an inherently weak or vulnerable region of the sapphire component 310. In particular, in some embodiments, the portion of sapphire component 310 located between the opening 311 and the nearest edge of the sapphire component 310 may be the narrowest portion of the sapphire component 310 and, thus, may be more vulnerable to mechanical failure than other portions of the sapphire component 310 that are also proximate to the opening 311.

In some embodiments, contact between the rod 517, 518, 519 and the sapphire component 310 may decrease the strength of the sapphire component 310 in that location. For example, conduction between the rod 517, 518, 519 and the sapphire component 310 may alter the heat treatment in a region near the contact and/or may generate a localized pressure that may locally alter the structure of the sapphire component 310. By contacting the edge of the opening 311 in two locations that are offset or spaced apart from the narrowest portion of the sapphire component 310, as shown in FIGS. 5B-5D, the strength of the sapphire component 310 may not be reduced in a location that may already be vulnerable or weakened due to the geometry of the sapphire component 310. Additionally, by contacting the sapphire component 310 in two locations, the weight of the sapphire component 310 may be more distributed as compared to a single contact location, which may reduce the impact of the contact on the heat treatment and/or the structure of the material near the multiple contact locations.

Other features or geometry of the fixture rods may facilitate uniform heat treatment of the sapphire components. For example, the rods may include one or more features that help maintain the position of the components within the furnace. In particular, as shown in FIGS. 6A-6D the rod may also include one or more surface features, including depressions, grooves, or notches, which may also facilitate positioning or locating each sapphire component within a furnace. The rod 616, 626, 636, 646 depicted in FIGS. 6A-6D may correspond to, and also illustrate features that may be incorporated into, example rod 416 of FIG. 4.

Figure 6A:
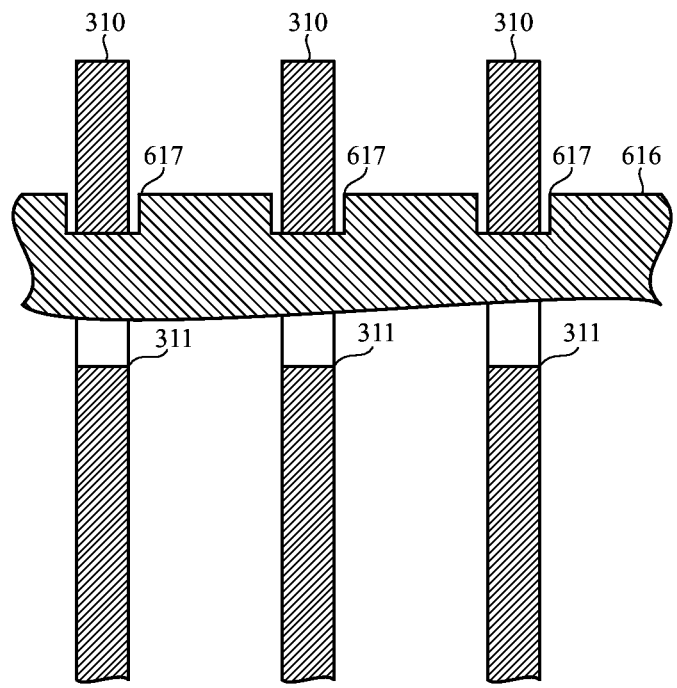
FIG. 6A depicts a cross-sectional view of an example notched rod with a sapphire component.

As shown in FIG. 6A, the rod 616 may include a series of notches 617 formed along the length of the rod 616. In the non-limiting example depicted in FIG. 6A, the notches 617 may be formed as a cut having a rectangular cross-section that extends through the rod 616 in a direction that is transverse to the length or lengthwise axis of the rod 616. In an alternative configuration, the notches 617 may be formed as a groove or ring-shaped cut that is formed around the periphery of the rod 616. The notch 617 may also include a non-rectangular cross-sectional shape and may include one or more beveled or rounded edges or contours as depicted in FIGS. 6C-6D.

In the example depicted in FIG. 6A, the notches 617 may be configured to maintain a position and orientation of a respective sapphire component 310 along the length of the rod 616. Additionally, each notch 617 may prevent or limit the rotation or pivoting of a respective sapphire component 310 with respect to the rod 616. This may prevent or reduce contact between adjacent sapphire components 310. In some cases, contact between adjacent sapphire components 310 may adversely affect the heat treatment and/or the surface finish of the sapphire components 310.

Figure 6B:
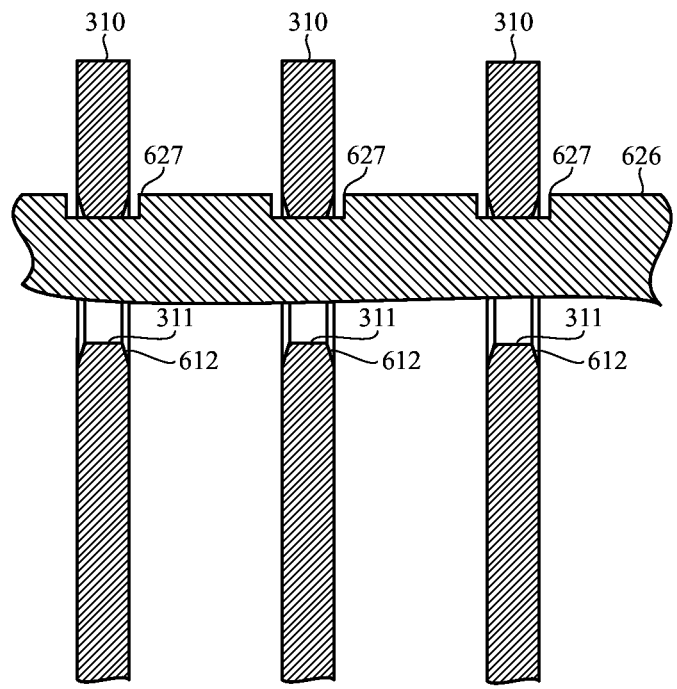
FIG. 6B depicts a cross-sectional view of an example notched rod with a sapphire component having a chamfer.

As shown in FIG. 6B, the opening 311 of the sapphire component 310 may include an edge feature, such as a beveled edge 612. In particular, a beveled edge 612, such as a chamfer or edge break, may be formed around the opening 311 of the sapphire component 310. The beveled edge 612 may have a height that is approximately equal to a depth of a respective notch 627 formed in the rod 626. In some implementations, the beveled edge 612 may prevent or reduce the possibility of the notch 627 contacting a polished face or outer surface of the sapphire component 310, which may affect the finish of the sapphire component 310. The example depicted in FIG. 6B is provided as one example implementation and the openings 311 of the sapphire component 310 may include another type of edge feature, such as a rounded edge or other edge feature that reduces or prevents contact between the notch 627 and a polished surface of the sapphire component 310.

Figure 6C:
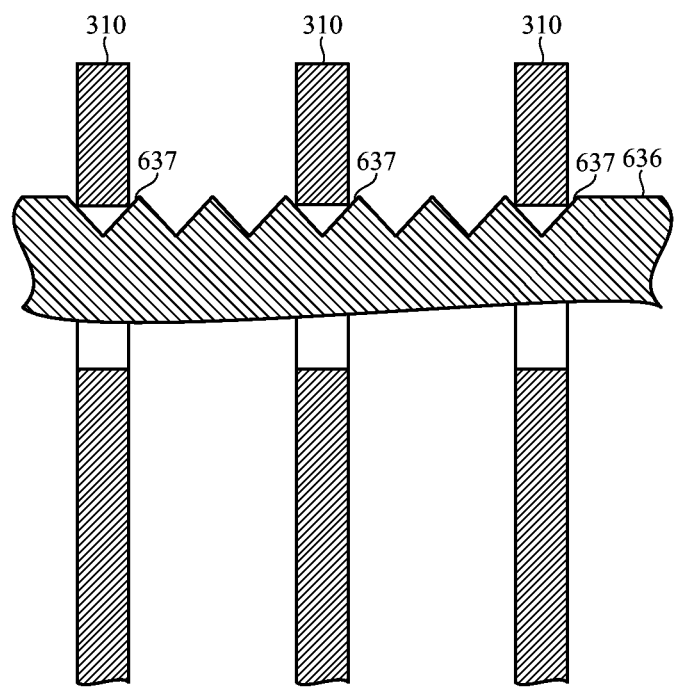
FIGS. 6C-6D depict cross-sectional views of example notched rods having alternative notch geometries.
Figure 6D:
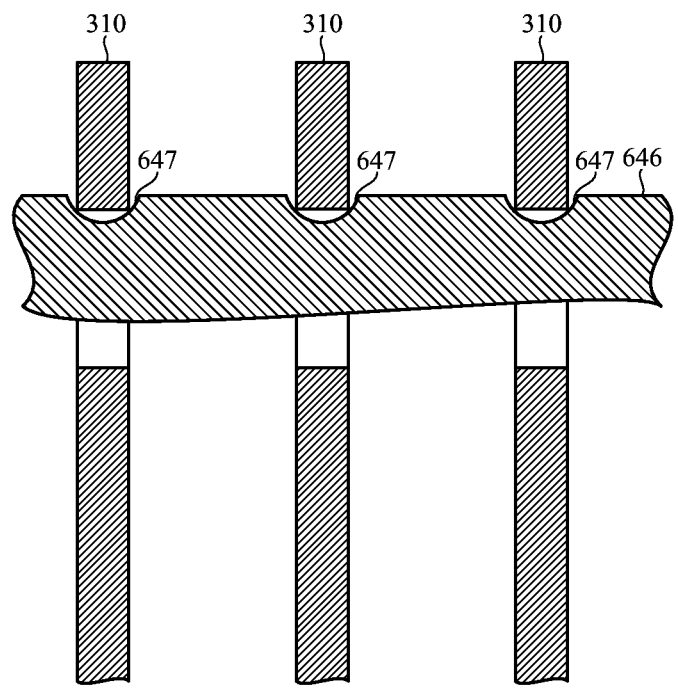

As shown in FIG. 6C, an example rod 636 may include a series of V-shaped notches 637 that are formed along the length of the rod 636. Similar to the previous examples, the notches 637 may be configured to maintain a position and orientation of a respective sapphire component 310 along the length of the rod 636. The notches 637 may be formed as a series of angled cuts that are formed lateral to the length of the rod 636. The notches 637 may also be formed as a series of angled grooves that are formed around the perimeter or outer surface of the rod 636. In the depicted configuration, the notches 637 may be referred to as a saw-tooth or serrated pattern of notches.

As shown in FIG. 6D, an example rod 646 may include a series of U-shaped notches 647 that are formed along the length of the rod 646. Similar to the previous examples, the notches 647 may be configured to maintain a position and orientation of a respective sapphire component 310 along the length of the rod 646. The notches 647 may be formed as a series of scalloped cuts that are formed lateral to the length of the rod 646. The notches 647 may also be formed as a series of curved grooves that are formed around the perimeter or outer surface of the rod 646.

The fixture used to position the sapphire components in the furnace may be used to position or mount other components or elements that improve a heat-treating process. In particular, the fixture may facilitate the use of a shield element or shield enclosure that is configured to provide a more uniform thermal distribution around the sapphire components.

Figure 7A:
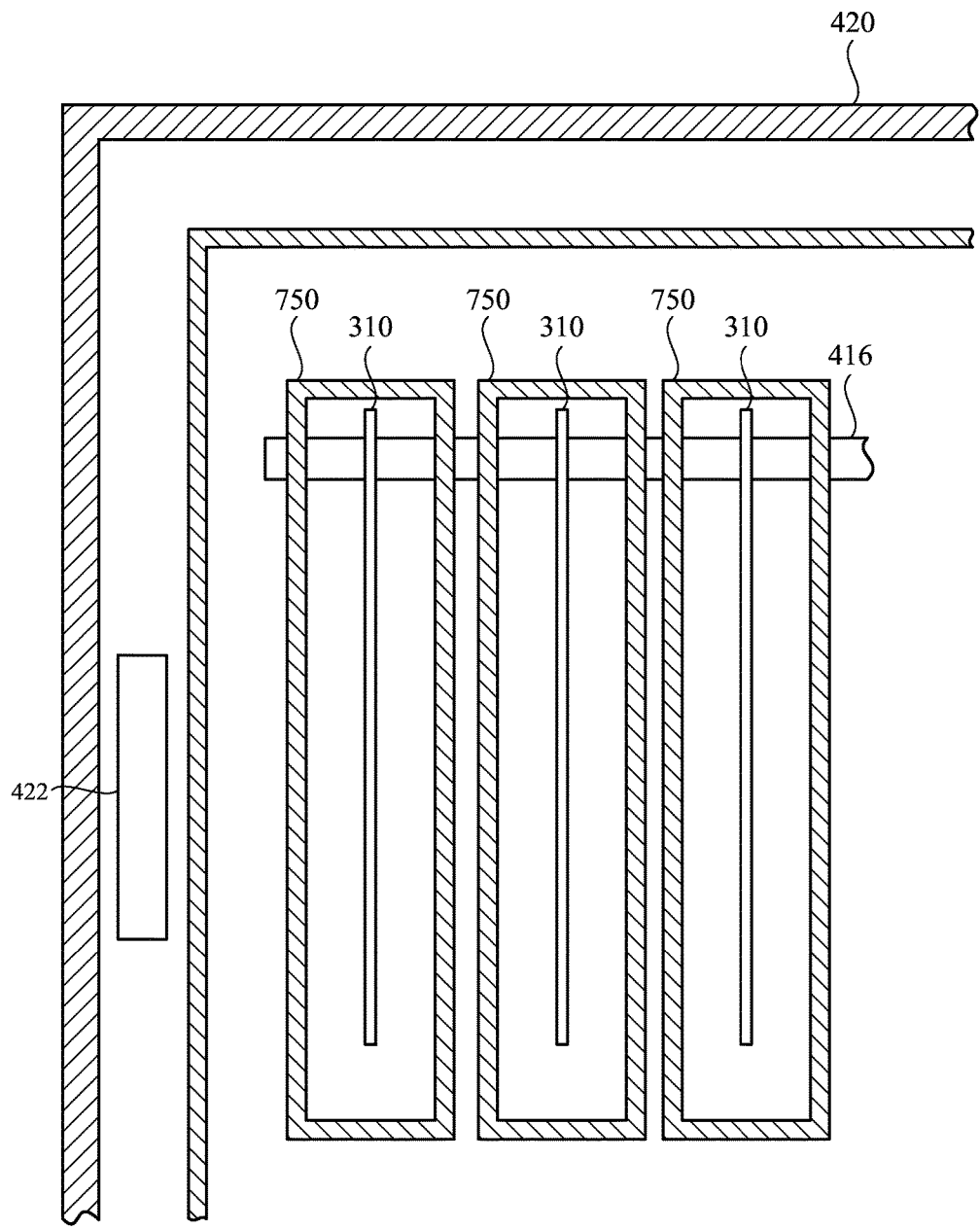
FIGS. 7A-7B depict example shields used in a heat-treating process.
Figure 7B:
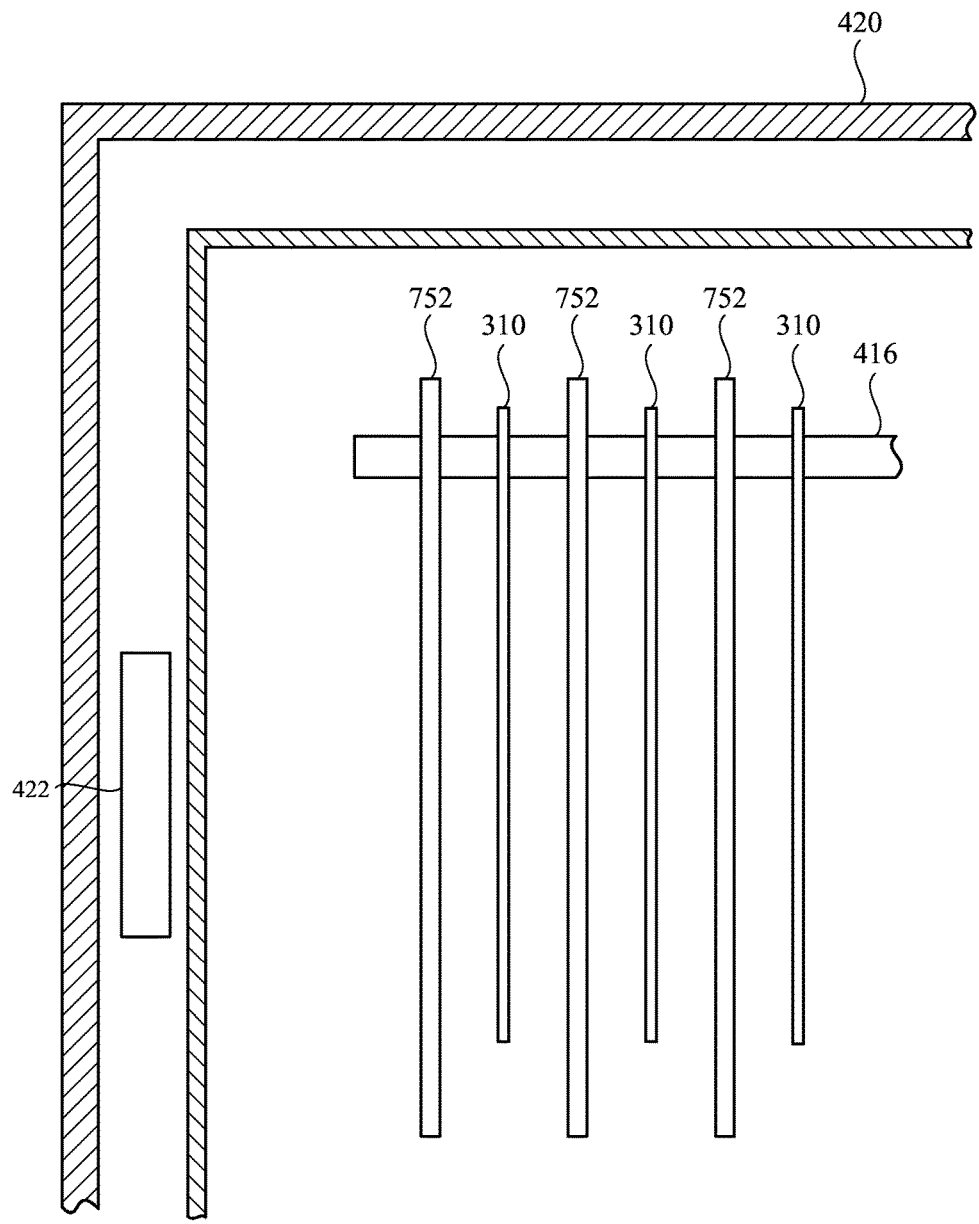

FIGS. 7A-7B depict example shields that can be used in a heat-treating process. In particular, FIG. 7A depicts an example shield enclosure 750 and FIG. 7B depicts an example shield element 752 that may be used in a heat-treating process or as part of a heat-treating system. The shield enclosure 750 and/or the shield element 752 may be incorporated into a heat-treating system 400, as described above with respect to FIG. 4. In general, the shield enclosures 750 and the shield elements 752 may be generically referred to as "shields" or "shield components."

FIG. 7A depicts an example configuration including multiple shield enclosures 750 positioned within the internal volume of a furnace 420. In the present example, the shield enclosures 750 are suspended from the rod 416 of a fixture. The shield enclosures 750 may include one or more openings that receive the rod 416 and allow the shield enclosures 750 to hang or suspend from the rod 416. In some embodiments, the shield enclosures 750 include a slotted opening and an open bottom section that allow the shield enclosures 750 to be placed over the rod 416 and sapphire components 310. This configuration may allow installation of the shield enclosures 750 after the sapphire components 310 have already been installed or positioned along the length of the rod 416.

As shown in FIG. 7A, each shield enclosure 750 may at least partially enclose a respective sapphire component 310. In some embodiments, the shield enclosures 750 may at least partially cover or overlap two or more surfaces of the sapphire component 310. In the present example, the shield enclosures 750 cover or overlap at least the two sheet faces of the sapphire component 310, which may correspond to, for example, a front and rear face of a cover sheet sapphire component 310. It is not necessary that the shield enclosure 750 fully enclose a respective sapphire component 310 and, in some cases, the shield enclosure 750 may include one or more openings or open sections. The shield enclosure 750 may include a slotted opening that facilitates installation or assembly of the shield enclosure 750 over the rod 416. The shield enclosure 750 may not form a fully formed or fully enclosed box and may be, for example, open along the top, the bottom, or one or more of the sides of the shield enclosure 750.

The shield enclosures 750 of FIG. 7A may be configured to provide a more uniform thermal distribution around a respective sapphire component 310. The shield enclosures 750, when heated to the internal temperature of the furnace 420 may produce a more uniform radiant heat source for a respective sapphire component 310. The shield enclosures 750 may also help to reduce the effects of hot spots or non-uniform heating within the furnace 420. If a portion of the sapphire component is located closer to the heating element 422 or a hot spot within the furnace 420, the shield enclosure 750 may help distribute the heat produced by the heating element 422 or hot spot and improve the thermal distribution across the sapphire component 310.

The shield enclosures 750 of FIG. 7A may also be configured to reduce contaminants from contacting or otherwise affecting the sapphire components 310 during a heat-treating process. The shield enclosures 750 may reduce or prevent particulate or other contaminants from being deposited during the heat-treating process, which can affect the surface finish of the sapphire component 310. The shield enclosures 750 may also protect the sapphire components 310 from particle emissions produced by the heaters or other elements of the furnace 420. The shield enclosures 750 may be formed from a sapphire material, a tungsten material, or other material that is able to withstand the sustained high temperatures of a heat-treatment process.

FIG. 7B depicts an alternative shield configuration in which shield elements 752 that are positioned within the internal volume of a furnace 420 interspersed with the sapphire components 310. The shield elements 752 may include one or more openings that receive the rod 416 and allow the shield elements 752 to hang or suspend from the rod 416. The shield elements 752 include slotted openings that allow the shield elements 752 to be placed over the rod 416.

As shown in FIG. 7B, each shield element 752 is positioned between two adjacent sapphire components 310. In some embodiments, the shield elements 752 are interspersed with the sapphire components 310 resulting in an alternating arrangement of sapphire components 310 and shield elements 752. The shield elements 752 may have a shape that generally corresponds to the shape of the sapphire components 310. In some embodiments, the shield elements 752 are larger than the sapphire components 310 to ensure an overlap between a shield element 752 and a respective pair of adjacent sapphire components 310.

Similar to the example described above with respect to FIG. 7A, the shield elements 752 of FIG. 7B may provide a more uniform thermal distribution around a respective sapphire component 310. For example, the shield elements 752, when heated to the internal temperature of the furnace 420, may produce a more uniform radiant heat source for a respective sapphire component 310. The shield elements 752 may also help to reduce the effects of hot spots or non-uniform heating within the furnace 420 by, for example, distributing the heat produced by a nearby heating element 422 or hot spot, which may improve the thermal distribution across the sapphire component 310. Also similar to the previous example, the shield elements 752 of FIG. 7B may also be configured to reduce contaminants from contacting or otherwise affecting the sapphire components 310 during a heat-treatment process. In some embodiments, the shield elements 752 are formed from sapphire, tungsten, or other material that is able to withstand the sustained high temperatures of a heat-treatment process.

Figure 8:
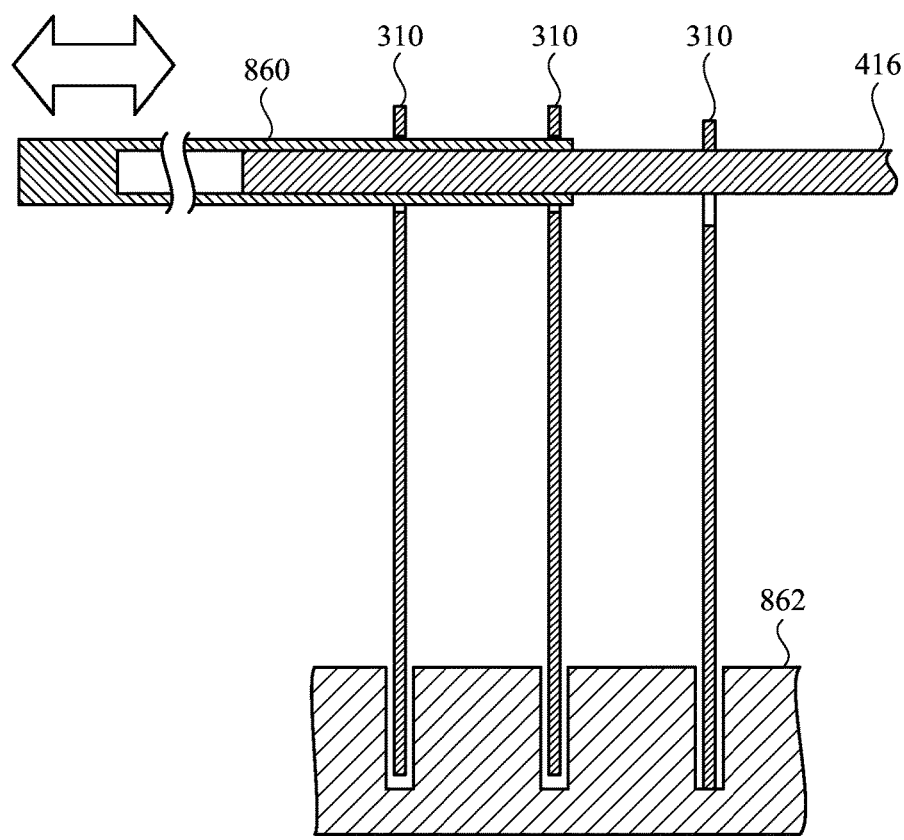
FIG. 8 depicts a cross-sectional view of an example sleeve tool used to place components on a rod.

In some embodiments, a separate installation fixture or jig may be used to install the sapphire components on a fixture. FIG. 8 depicts an example sleeve tool 860 and fixture jig 862 used to assemble or install sapphire components 310 on a rod 416. The configuration depicted in FIG. 8 may be used to place a group or set of sapphire components 310 on the rod 416 of a fixture that can be placed or positioned within a furnace, similar to the configuration described above with respect to FIG. 4. The following technique may be used to place multiple sapphire components 310 on a rod 416 while minimizing or reducing the potential damage to the sapphire components 310. For example, the technique outlined below may be advantageous over other techniques that may involve sliding components directly over the surface of the rod 416, which may cause scratching or marring of the component.

Multiple sapphire components 310 may be placed into a fixture jig 862, as shown in FIG. 8. Each sapphire component 310 may be placed into a slot or groove feature formed into the fixture jig 862. In some implementations, the slot or groove feature may have a width that is slightly larger than the thickness of the sapphire component 310 and a slot or groove depth that is sufficiently deep to hold the sapphire component 310 in an upright position. The slot or groove features may also include a feature or element that helps to locate the sapphire component 310 along the length of the slot or groove, which may help align the openings (311 of FIG. 3) of the group of sapphire components 310 placed in the fixture jig 862. In implementations in which the rod 416 includes a series of notches arranged down the length of the rod 416 (as described above with respect to FIGS. 6A-6D), the slot or groove features formed in the fixture jig 862 may have a spacing that corresponds to the notches formed in the rod 416, which may facilitate placement of the sapphire components 310 within the notches of the rod 416.

In some embodiments, the fixture jig 862 is formed from a material that is softer than the sapphire component 310 to reduce the chance of scratching the sapphire components 310 or causing other physical damage. In some cases, the fixture jig 862 is formed from a plastic material, such as a polymide (e.g., nylon), polyoxymethylene (e.g., Delrin), or other type of polymer material. The fixture jig 862 may also be formed from a metal material and coated with a softer material to reduce scratching or other damage to the sapphire components 310. In some embodiments, the slot or groove features of the fixture jig 862 are machined or cut into the material using a saw, end mill, or other cutting tool.

While the series of slots or groove features locate the sapphire components 310 along the length of the fixture jig 862, the fixture jig 862 may also include one or more features or elements that locate the sapphire components 310 from side-to-side within the slot or groove feature, which may also be a direction described as transverse to the length of fixture jig 862. In some embodiments, when the sapphire components 310 are placed in the fixture jig 862 the openings (311 of FIG. 3) may be approximately or substantially aligned. Once the sapphire components 310 are placed in the fixture jig 862, a sleeve tool 860 may be inserted through the opening (311 of FIG. 3) of each sapphire component 310. The fixture jig 862 may also include a protrusion or other feature that helps guide and hold the sleeve tool 860 while it is being inserted through the openings of the sapphire components 310. For example, the fixture jig 862 may include a protrusion at each end having a slotted opening or saddle for guiding and supporting the sleeve tool 860.

As shown in FIG. 8, the sleeve tool 860 includes a hollow or tubular portion having a bore that extends down the length of the sleeve tool 860. The bore may be configured to slidably engage or receive the rod 416 and may be approximately the same length of the rod 416. In embodiments in which the rod 416 has a profile shape, such as described above with respect to FIGS. 5A-D, the bore in the sleeve tool 860 may have a corresponding shape. Alternatively, the bore does not correspond directly to the shape of the rod 416, but is configured to accommodate or slidably receive the rod 416. In some embodiments, the sleeve tool 860 is formed from a plastic material, such as a polymide (nylon), polyoxymethylene (Delrin), or other type of polymer material. The sleeve tool 860 may be formed by a machining, molding, or other suitable manufacturing process.

Once the sleeve tool 860 has been inserted through the openings of the sapphire components 310, the sleeve tool 860 (and the corresponding sapphire components 310) may be slid over the rod 416. This operation may also be described as inserting the rod 416 into the sleeve tool 860. Because the sleeve tool 860 is positioned between the sapphire components 310 and the rod 416, the sapphire components 310 may not be damaged during the installation of the sleeve tool 860 over the rod 416.

Once the rod 416 and sleeve tool 860 have been slid together, the fixture jig 862 may be removed from the group of sapphire components 310. Once the fixture jig 862 has been removed, the sapphire components 310 may rest on the outer surface of the sleeve tool 860. At this point, the sleeve tool 860 may be removed or slid with respect to the rod 416 while the sapphire components 310 remain fixed with respect to the rod 416 resulting in the sapphire components 310 resting or being positioned along the rod 416. In some implementations, the fixture jig 862 remains in place as the sleeve tool 860 is removed, which may help to maintain the spacing and position of each sapphire component 310 along the length of the rod 416.

Figure 9:
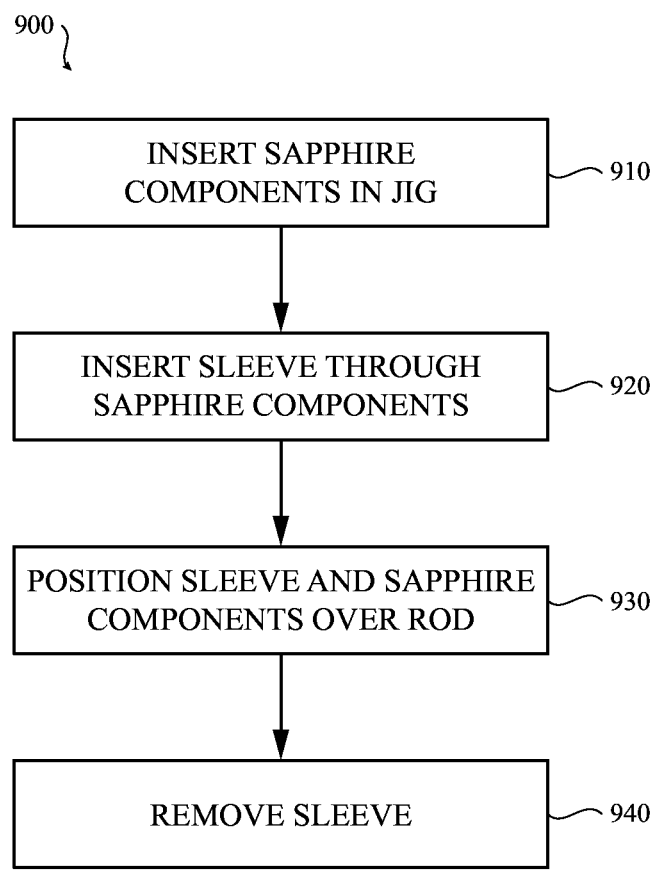
FIG. 9 depicts a flow chart for an example process for installing sapphire components within a furnace using an installation tool.

FIG. 9 depicts an example process 900 for installing or assembling a group of sapphire components on the rod of a fixture. The operations of process 900 may be used in conjunction with the configuration described above with respect to FIG. 8. In general, process 900 may be used to load multiple sapphire components onto the rods of a fixture, which may be positioned in a furnace similar to the example system described above with respect to FIG. 4.

In operation 910, a group of sapphire components are inserted into a jig. With reference to FIG. 8, a group of two or more sapphire components 310 may be inserted into a series of groove or slot features formed into a fixture jig 862. Each slot feature of the fixture jig 862 holds a corresponding sapphire component 310 in an upright position. In some cases, each slot feature may also locate the sapphire component 310 along a direction that is transverse to the length of the fixture jig 862, which may result in an alignment of the sapphire components 310 along the length of the fixture jig 862.

In operation 920, a sleeve is inserted through the group of sapphire components. With reference again to FIG. 8, a sleeve tool 860 may be inserted through an opening (311 of FIG. 3) formed in each sapphire component 310. In some cases, the sleeve tool 860 is formed from a material that is softer than the sapphire component 310, which may reduce the possibility of scratching or marring the sapphire component 310 during operation 920.

In operation 930, the sleeve and sapphire components are positioned over a rod. With reference again to FIG. 8, the sleeve tool 860 may have a bore that is configured to slidably receive the rod 416. The sleeve tool 860 and the sapphire components 310 together may be positioned with respect to the rod 416 such that the rod 416 is inserted into the bore of the sleeve tool 860. The sleeve tool 860 and sapphire components 310 may be positioned relative to the rod 416 using the fixture jig 862. The sleeve tool 860 and sapphire components 310 may remain stationary and the rod 416 is inserted into the bore of the sleeve tool 860. As discussed above with respect to FIG. 8, because a portion of the sleeve tool 860 remains between the rod 416 and the sapphire component 310, the positioning operation of 930 may be performed without significant risk of scratching or otherwise damaging the sapphire component 310. Once the rod 416 and sleeve tool 860 have been slid together, the fixture jig 862 may be removed from the group of sapphire components 310.

In operation 940, the sleeve is removed from the sapphire components and the rod. With reference again to FIG. 8, the sleeve tool 860 may be removed or slid with respect to the rod 416 while the sapphire components 310 remain fixed with respect to the rod 416 resulting in the sapphire components 310 resting or being positioned along the rod 416.

In some implementations, the fixture jig 862 remains in place as the sleeve tool 860 is removed, which may help maintain the spacing and position of each sapphire component 310 along the length of the rod 416. In embodiments in which the rod 416 includes a series of notches formed along the length of the rod, (see FIGS. 6A-6D) each sapphire component 310 may be placed in a respective notch as the sleeve tool 860 is removed.

Accordingly, the sapphire components may be placed along the length of the rod 416 without sliding the sapphire components directly along the outer surface of the rod 416, which may reduce the chance of scratching, marring, or otherwise damaging the sapphire components. One or more of the operations of process 900 may be repeated to assemble sapphire components on a fixture having multiple rods.

Figure 10:
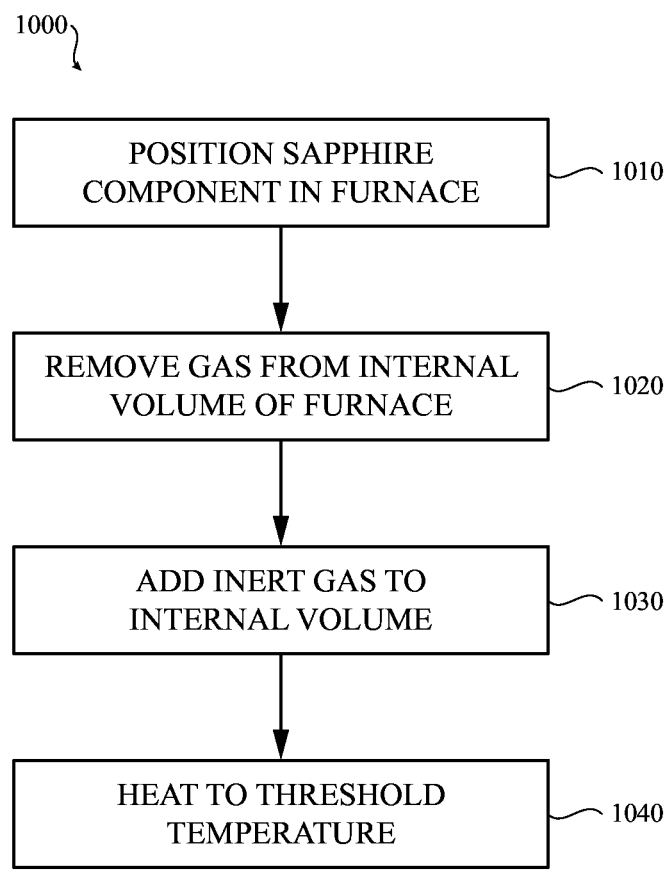
FIG. 10 depicts a flow chart for an example process for performing a heat-treating process on a sapphire component using an inert gas.

FIG. 10 depicts an example process 1000 for performing a heat-treating process on a sapphire component using an inert gas. The example process 1000 may be performed using a sapphire heat-treating system similar to the example described above with respect to FIG. 4. Additionally, the example process 1000 may be used in conjunction with one or more of the fixtures, rods, and installation techniques described above with respect to FIGS. 4-9.

Process 1000 may be used to heat treat and/or anneal the sapphire components to increase the strength, fatigue life, edge-bending strength and/or toughness of the sapphire components. In some cases, process 1000 may be used to produce a sapphire component having an edge strength that is greater than 900 MPa. In some embodiments, the process 1000 may facilitate mobility of the sapphire (crystal) material and may be used to heal small surface cracks or discontinuities within the material. Process 1000 may also relieve residual stresses which, in some cases, may cause failure, warping, and/or distortion of the sapphire component.

In some embodiments, process 1000 may be used to heat treat a sapphire component that may be used as a cover sheet for an electronic device, similar to the cover sheets and sapphire-based parts described above with respect to FIGS. 1A-3. In some instances, process 1000 may be used to reduce contaminants, which may cause surface defects or other potential quality issues with the heat-treated sapphire component. In some implementations, the process 1000 may be performed after all or significantly all of the polishing has been performed on the sapphire component. One advantage to performing heat treating after polishing is that the strength and structural quality of the sapphire material, which may be improved by the heat-treating process 1000, may not be compromised or partially reversed by subsequent polishing or surface treating operations. Because process 1000 may be the final or near-final manufacturing operation, performing process 1000 without creating defects that require further polishing may be advantageous.

In operation 1010, a sapphire component is positioned in a furnace. In some embodiments, the sapphire component is placed within a furnace as part of a group or set of sapphire components. The sapphire components may be positioned in the furnace such that each sapphire component is separated by the other sapphire components by at least a small gap or space. That is, the sapphire components are not stacked or placed in contact with each other. In some implementations, the sapphire components may be installed or assembled onto a fixture rack similar to the fixture rack 410 described above with respect to FIG. 4. The fixture rack may include multiple rods for suspending or positioning the sapphire components in a spaced or substantially distributed arrangement within the internal volume of the furnace. The rods of the fixture rack may include a profile shape and/or notches or other features to facilitate heat treating and/or positioning the sapphire components similar to, as described above, with respect to FIGS. 5A-5D and 6A-6D.

Operation 1010 may be performed using all or part of the process 900 described above with respect to FIG. 9. In particular, process 900 may be used to load a set of sapphire components on each rod of the fixture. As previously described, process 900 may reduce or eliminate scratching, marring, or otherwise damaging the sapphire components during installation.

In some implementations of operation 1010, the sapphire components are positioned within the furnace along with one or more shields, similar to as described above with respect to FIGS. 7A-B. In some embodiments, the shields may facilitate a uniform thermal distribution or thermal exposure experienced by each sapphire component. In some embodiments, the shield components may prevent or reduce the occurrence of contaminants from being deposited on the surface of the sapphire components, which may improve the quality of the heat-treatment process and prevent the need for post-heat-treatment surface-treating operations.

All or a portion of operation 1010 may be performed in an environment that has been treated to have a reduced amount of particles or potential contaminants. For example, the sapphire components, fixture components, installation tools and the furnace may be placed in a cleanroom environment. In some implementations, the cleanroom environment includes an air delivery and filtration system that is configured to provide an environment that meets a class 10 or greater cleanroom standard under the Federal Cleanroom Standard 209E. In some implementations, the cleanroom is configured to meet a class 100 or greater cleanroom standard. In some implementations, the cleanroom is configured to meet a class 1,000 or greater cleanroom standard.

In operation 1020, gas is removed from the internal volume of the furnace. The internal volume of the furnace may be partially or fully evacuated by applying a vacuum or by otherwise pumping air out of the internal volume. That is, operation 1020 may involve removing some or all of the gas contained in the internal volume of the furnace. In some implementations, all, or substantially all, of the air within the internal volume of the furnace is evacuated during operation 1020. With reference to FIG. 4, a vacuum supply 430 may be operatively coupled to the internal volume of the furnace 420. The vacuum supply 430 may apply a vacuum ranging between 380 and 630 mm Hg.

In some embodiments, operation 1020 helps to clear the internal volume of the furnace from particulates or other contaminants. Contaminants present in the furnace may become deposited on the sapphire components and, in some cases, may become adhered to the surface as a result of the annealing or heat-treating operation. As previously discussed, contaminants may cause a visual defect on the surface of the sapphire component, which may require additional polishing or surface treatment operations. For example, surface contaminants may create a visual aberration that appear as a white or hazy dot surrounding the location of the contaminant. Additionally or alternatively, surface contaminants may alter one or more thermal properties of the sapphire, which may adversely affect the quality of the heat-treating process 1000.

In operation 1030, an inert gas is added or introduced to the internal volume of the furnace. In some embodiments, a gas is pumped or otherwise delivered to the internal volume of the furnace. The inert gas may have been previously filtered to reduce particulate contaminants. With reference to FIG. 4, the gas supply 440 may provide an inert gas to the interior volume of the furnace 420. In some embodiments, the gas supply 440 may be configured to provide an inert gas, such as argon, at an atmospheric or near atmospheric pressure. In some embodiments, the gas supply 440 may be configured to provide an inert gas at a pressure that is greater than or less than atmospheric pressure.

With regard to operation 1030, a variety of different types of inert gases, combinations, and/or compounds of inert gases may be provided or supplied. Example, inert gases include helium, neon, argon, krypton, xenon, combinations of inert cases, and/or inert gas compounds. In general, due to the heating of operation 1040, it may be generally advantageous that the inert gas provided in operation 1030 be stable and non-reactive at elevated temperatures.

In operation 1040, the furnace is heated to a threshold temperature. In general, the heating operation of operation 1040 is performed to anneal or otherwise alter the structural properties of the sapphire material. For example, as discussed previously, heating the sapphire component may increase the strength, fatigue life, edge-bending strength and/or toughness of the sapphire components. In some embodiments, the heating operation 1040 may increase the mobility of the material, which may help to heal small surface cracks or discontinuities within the material. Additionally or alternatively, the heating of operation 1040 may help to relieve residual stresses which, in some cases, may cause failure, warping, and/or distortion of the sapphire component.

In operation 1040, the threshold temperature may be maintained for a particular duration to facilitate the strengthening of the sapphire component. In one non-limiting example, the threshold temperature is maintained within 5 degrees of a target temperature for a duration of one hour or longer. In another non-limiting example, the threshold temperature is maintained for a duration of two hours or longer. In another non-limiting example, the threshold temperature is maintained for a duration of three hours or longer.

The threshold temperature may reflect the internal temperature of the furnace as measured by one or more temperature sensors. In some cases, the threshold temperature corresponds to an estimated or predicted temperature of the sapphire material within the interior volume of the furnace. The estimated or predicted temperature may be based on a thermal model or other predictive framework for estimating temperature of the sapphire components. In some embodiments, the furnace is heated to a threshold temperature of 1200 Celsius or greater. In some embodiments, the furnace is heated to a threshold temperature of 1600 Celsius or greater. In some embodiments, the furnace is heated to a threshold temperature between 1750 and 1850 Celsius.

In some embodiments, the heating operation of operation 1040 is precisely controlled to be performed at a particular rate of heating. In some implementations, as described in more detail below with respect to process 1100 of FIG. 11, the heating operation may include heating to a first threshold temperature at a first heating rate, maintaining a temperature for a particular duration, and then heating to a second threshold temperature at a second heating rate that may be different than the first heating rate.

With respect to operation 1040, the heating operation may be performed using a type of heating element that may be less prone to impacting the surface quality or surface finish of the sapphire component during the heat-treating operation. In some cases, a carbon-based heating element may produce emissions that can cause pitting or surface deposits on the sapphire components during a heating operation. To reduce potential emissions, non-carbon heating elements may be used to perform operation 1040. Example non-carbon heating elements include molybdenum heating elements, tungsten heating elements, and the like. In some cases, carbon heating elements may be used, but measures may be taken to reduce the emissions, including, for example, pre-cycling the heaters or "bake-out" may be performed before heat-treating the sapphire components. Additionally, shields may be used to protect the sapphire component from emissions. A cleaning operation, such as a hydrogen cleaning, may be performed to reduce contamination and/or emissions produced by the heating elements. A hydrogen cleaning operation may be performed, for example, by heating the furnace to a high temperature and introducing a hydrogen gas.

After the heat-treating operation 1040 is complete, the internal volume of the furnace may be returned to an external ambient temperature (e.g., room temperature). In some implementations, the rate of cooling is controlled to reduce or limit internal stresses in the sapphire component that may be formed due to thermal non-uniformity within the material of the sapphire component. The cooling may be performed by venting the internal volume of the furnace or by using another technique to extract heat from the furnace.

While the operations of process 1000 are described in a particular order, the exact sequence of operations may vary between embodiments. For example, some heating in accordance with operation 1040 may be performed at the same time either or both operations 1020 and 1030 are performed. Additionally, process 1000 may be combined with other processes and/or techniques described herein. In particular, process 1000 may be performed in conjunction with the sapphire component loading process 900 of FIG. 9, the heat-treating process 1100 of FIG. 11 and/or the cleaning process 1200 of FIG. 12.

In some cases, process 1000 is performed after the sapphire component has been polished. That is, the sapphire component may be polished to a final or near final surface finish prior to being heat treated. In some cases, process 1000 is the final or near final manufacturing process for the sapphire component. Polishing before heat treating may be advantageous because any small cracks or strength-impairing defects in the surface of the sapphire component that are created by the polishing process may be healed by the heat-treating process 1000. Additionally, process 1000 may be performed such that the surfaces of the heat-treated sapphire component are substantially free of white dots, haze, or other optical defects. In some implementations, no substantial polishing or abrasive surface treating operations are performed on the sapphire component after the heat-treating process 1000.

In some embodiments, a portion of the sapphire component is polished or treated after the heat-treating process 1000 without polishing the highly polished or optically critical portions of the component. For example, in some cases, a portion of the hole or opening may be strengthened by using a refractory metal (e.g., tungsten) fixture during the heat-treating process. The treated portion may be re-polished to remove any marks. In some cases, the sapphire component is not annealed or heat treated after the partial polishing.

Figure 11:
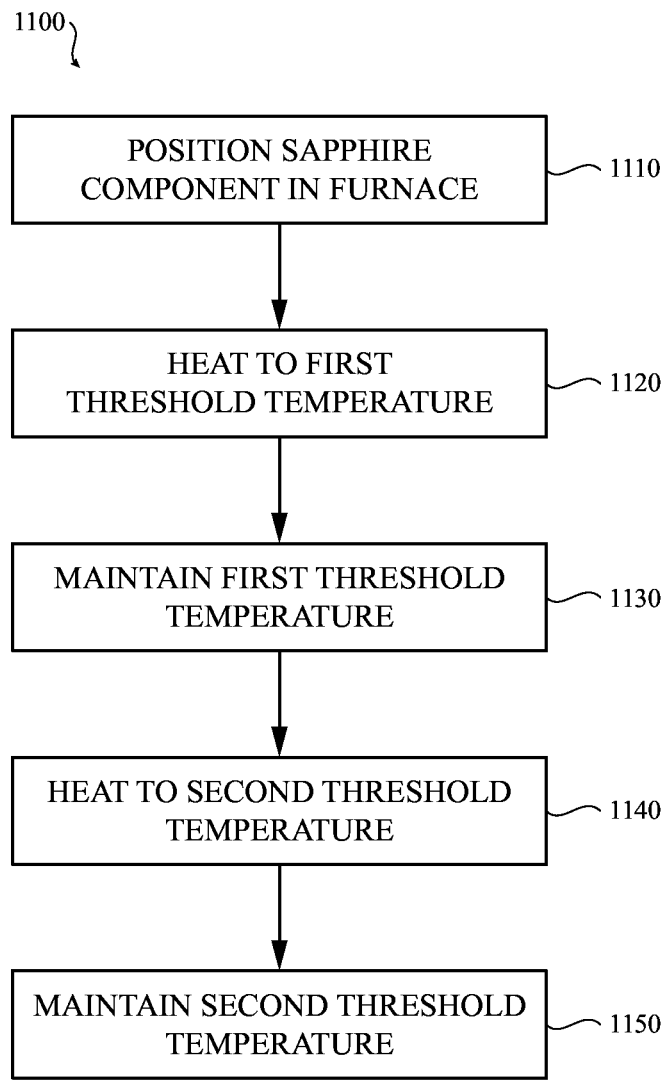
FIG. 11 depicts a flow chart for an example process for performing a two-stage heat-treating process on a sapphire component.

FIG. 11 depicts an example process for performing a two-stage heat-treating process 1100 on a sapphire component. Process 1100 may be configured to anneal the sapphire component using one or more intermediate (or threshold) temperatures. Process 1100 may maintain the threshold temperature(s) for a specified period or duration of time to reduce the thermal stress within the sapphire component and reduce the risk of defects being formed within the component during the annealing process.

Similar to the previous example, process 1100 may be used to heat treat and/or anneal the sapphire components to increase the strength, fatigue life, edge-bending strength and/or toughness of the sapphire components. The process 1100 may be used to produce a sapphire component having an edge strength that is greater than 900 MPa. In some embodiments, the process 1100 may facilitate mobility of the sapphire crystal material and may be used to heal small surface cracks or discontinuities within the material. Process 1100 may also relieve residual stresses which, in some cases, may cause failure, warping, and/or distortion of the sapphire component. Also similar to the previous example, process 1100 may be used to heat treat a sapphire component that may be used as a cover sheet for an electronic device, similar to the cover sheets and sapphire-based parts described above with respect to FIGS. 1A-3.

In operation 1110, a sapphire component is positioned within a furnace. The sapphire component may be placed within a furnace as part of a group or set of sapphire components. Aspects of operation 1110 may correspond to one or more aspects of operation 1010 discussed above with respect to FIG. 10. In particular, operation 1110 may include the use of a fixture and/or rack for positioning the sapphire components in the furnace. Operation 1110 may also include the use of an installation tool as described above with respect to FIG. 9. In some implementations, operation 1110 may include installation of shield elements or shield enclosures interspersed with or surrounding the sapphire components. In some implementations, operation 1110 is performed in an environment having a reduced particle or contamination level, such as a cleanroom.

In operation 1120, the furnace is heated to a first threshold temperature. Operation 1120 may include increasing the temperature of the internal volume of the furnace to the first threshold temperature or intermediate temperature, which may be less than an annealing temperature. The heating of the furnace may be performed by using one or more heating elements, as described above with respect to FIG. 4. The heating elements may be controlled or operated by a furnace controller that is configured to perform one or more temperature control operations including, for example operations that increase the temperature of the internal volume and operations that maintain a set point or threshold temperature within the internal volume. The furnace controller may use the output from one or more temperature sensors as feedback for the temperature control operations.

The first threshold temperature may an intermediate temperature that is below an annealing temperature of the sapphire component. For example, the first threshold temperature may be between 900 degrees and 1400 degrees Celsius. In some embodiments, the first threshold temperature is between 1000 and 1300 degrees Celsius. In some embodiments, the first threshold temperature is approximately 1250 degrees Celsius.

During the heating operation 1120, there may be some non-uniformity within the oven and/or within the sapphire components being heated. This may be due in part to the location of the heaters within or near the walls of the furnace. In some cases, a thermal gradient or temperature difference within the sapphire components may cause internal stress, which may result in a slip or shift in the lattice or crystalline structure of the material. The slip or shift may produce a slip line which may be visually detected in the final sapphire component. Because a slip line is internal to the sapphire material, it may be difficult if not impossible to remove by further processing. Furthermore, increasing the temperature of sapphire material may increase the mobility of the crystalline structure and reduce the amount of internal stress that may produce a slip line.

The stress within the material of the sapphire component may depend on several factors including, for example, temperature in the furnace, rate of heating, proximity to heating elements, use of shield elements, and other factors. While it may be advantageous to heat the furnace at a rate that is slow enough to produce a uniform or substantially uniform thermal condition throughout the sapphire components being heated, a slow rate of heating may not enable acceptable production throughput. Thus, in some implementations, the rate of heating in operation 1120 is increased to meet production requirements yet the threshold temperature is maintained below a level that would result in the formation of slip lines.

With respect to operation 1120, the heating rate may be performed as quickly as possible without risking the formation of slip lines or creating other undesirable artifacts. In some cases, the first threshold temperature is reached in less than ten hours. In some cases, the first threshold temperature is reached in less than five hours. In some cases, the first threshold temperature is reached in less than two hours.

With respect to operation 1120, both the threshold temperature and rate of heating may be configured to reduce the chance that slip lines will be formed within the material. For example, the operation 1120 may be performed at a temperature and a heating rate that does not produce internal thermally induced stress that exceeds an amount likely to produce a slip line. In some cases, operation 1120 is performed at a rate and threshold temperature that results in internal stress of the sapphire component being below 10 MPa. In some cases, operation 1120 is performed resulting in internal stress of the sapphire component being 5 MPa or less.

In operation 1130, the first threshold temperature is maintained for a first duration. In some implementations, operation 1130 allows heat to become more evenly distributed across the sapphire component, which may reduce internal stress in the material and may prevent or reduce the risk of the formation of undesirable artifacts such as slip lines. The first duration of operation 1130 may be sufficient reduce or eliminate the thermal gradient across the sapphire component. In some cases, the first threshold temperature is maintained for 30 minutes or longer. In some cases, the first threshold temperature is maintained for one hour or longer. In some cases, the first threshold temperature is maintained for two hours or longer.

With regard to operation 1130, the first threshold temperature may be maintained within a tolerance or range of acceptable temperatures. Due to practical limitations of a furnace or other heating apparatus, it may not be possible to maintain a temperature without some amount of variation. The variation in temperature may depend on the thermal response of the heating elements, the sensitivity of any temperature sensors, the control algorithm used to control the heating elements, and other similar factors. Thus, in some implementations, maintaining the first threshold temperature includes maintaining the first threshold temperature within a range of +/−20 degrees Celsius. In some implementations, maintaining the first threshold temperature includes maintaining the temperature within a range of +/−50 degrees Celsius. In some implementations, maintaining the first threshold temperature includes maintaining the temperature within a range of +/−100 degrees Celsius.

In operation 1140, the furnace is heated to a second threshold temperature. Operation 1140 may include increasing the temperature of the internal volume of the furnace to an annealing temperature. That is, the second threshold temperature may correspond to an annealing temperature and may result in a strengthening of the sapphire component. In particular, the second threshold temperature may be high enough to help to heal cracks, fractures, and other discontinuities in the sapphire material, which may strengthen the part and improve fatigue. The second threshold temperature may be 1500 degrees Celsius or higher. In some cases, the second threshold temperature may be greater than 1700 degrees Celsius. The second threshold temperature may be greater than 2100 degrees Celsius.

With regard to operation 1140, the rate of heating to obtain the second threshold temperature may be controlled or limited to a maximum rate. The rate of heating may be below a maximum rate to reduce the thermal stress that may result from a non-uniform temperature distribution across the part. In some implementations, the rate of heating to the second threshold temperature is less than the rate of heating to the first threshold temperature of operation 1120. The heating from the first threshold temperature to the second threshold temperature may occur in less than ten hours, and, in some cases, the second threshold temperature may be reached in less than five hours.

With respect to operation 1140, both the threshold temperature and rate of heating may be configured to reduce the chance that slip lines will be formed within the material. For example, the operation 1140 may be performed at a temperature and a heating rate that does not produce internal thermally induced stress that exceeds an amount likely to produce a slip line. In some cases, operation 1140 is performed at a rate and threshold temperature that results in internal stress of the sapphire component being below 10 MPa. In some cases, operation 1140 is performed resulting in internal stress of the sapphire component being 5 MPa or less.

In operation 1150, the second threshold temperature is maintained for a second duration. In some embodiments, the second threshold temperature or annealing temperature is maintained for a period of time that allows the sapphire material to reflow and heal surface cracks, scratches, and other discontinuities. The second threshold temperature may be maintained for one hour or longer. In some cases, the second threshold temperature is maintained for two hours or longer. In some cases, the second threshold temperature is maintained for five hours or longer.

With respect to operation 1150, the second threshold temperature is maintained within a tolerance or range of values. As described above with respect to operation 1130, the second threshold temperature may vary due to practical limitations of the furnace or heating apparatus. In some implementations, maintaining the second threshold temperature includes maintaining the second threshold temperature within a range of +/−5 degrees Celsius. In some implementations, maintaining the second threshold temperature includes maintaining the temperature within a range of +/−20 degrees Celsius. In some implementations, maintaining the second threshold temperature includes maintaining the temperature within a range of +/−50 degrees Celsius.

In some embodiments, after the heat-soaking operation 1150 is complete, the internal volume of the furnace may be returned to ambient or room temperature conditions. In some implementations, the rate of cooling is controlled to reduce or limit internal stresses in the sapphire component that may be formed due to thermal non-uniformity within the material of the sapphire component. The cooling may be performed by venting the internal volume of the furnace or by using another technique to extract heat from the furnace.

Process 1100 may be performed in a vacuum and inert gas heat-treatment process similar to process 1000 described above with respect to FIG. 10. The operations of process 1100 described above and depicted in FIG. 11 are provided by way of example and may be varied in some implementations. For example, more than one intermediate threshold temperature may be maintained during the heating and annealing process. In some embodiments, a first, second, third, or other threshold temperatures may be maintained for respective durations before the sapphire component is heated to the final annealing temperature. Some advantages include improved thermal uniformity and reduced internal stress within the sapphire material.

In some cases, process 1100 is performed after the sapphire component has been polished. That is, the sapphire component may be polished to a final or near final surface finish prior to being heat treated. In some cases, process 1100 is the final or near final manufacturing process for the sapphire component. Polishing before heat treating may be advantageous because any small cracks or strength-impairing defects in the surface of the sapphire component that are created by the polishing process may be healed by the heat-treating process 1100. Additionally, process 1100 may be performed such that the surfaces of the heat-treated sapphire component are substantially free of white dots, haze, or other optical defects. In some implementations, no substantial polishing or abrasive surface treating operations are performed on the sapphire component after the heat-treating process 1100.

In some embodiments, a portion of the sapphire component is polished or treated after the heat-treating process 1100 without polishing the highly polished or optically critical portions of the component. For example, a portion of the hole or opening may be strengthened by using a refractory metal (e.g., tungsten) fixture during the heat-treating process. The treated portion may be re-polished to remove any marks. In some cases, the sapphire component is not annealed or heat treated after the partial polishing.

In some implementations, the sapphire components may be polished and/or cleaned before heat treating to improve the surface finish and overall quality of the parts. Small particles or contaminants may create surface defects or visual artifacts during heat treatment. In some cases, a particle or contaminant on the surface of a polished sapphire sheet may cause a white dot or haze during heat treating due to movement or rearrangement of the sapphire material around the particle or contaminant. Additionally, non-uniform or angled faces with respect to the crystallographic plane of the sapphire material may also result in a haze or visual artifact after heat treating or annealing.

Figure 12:
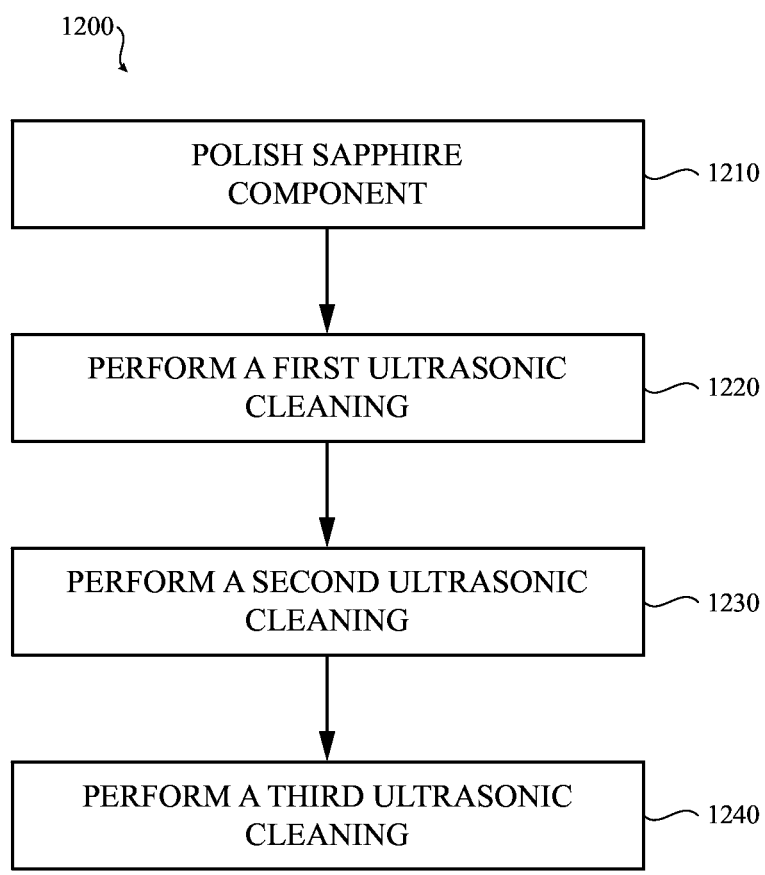
FIG. 12 depicts a flow chart for an example process for wet-cleaning a sapphire component.

FIG. 12 depicts an example process 1200 that can be used to prevent or reduce the risk of visual defects caused by contaminants and/or misalignment of surfaces with respect to the crystallographic plane of the sapphire material. In particular, process 1200 depicts a process for polishing and wet-cleaning a sapphire component. Process 1200 may be used alone or in conjunction with one of the heat-treating processes described above with respect to FIGS. 10 and 11.

In some embodiments, before the operations of process 1200 are performed, one or more pre-processing operations are performed on the sapphire component. For example, a cutting operation or series of cutting operations are performed on the sapphire component to produce a profiled or shaped sapphire component. A cutting operation may involve a laser and/or computer-numeric-controlled (CNC) machining system, and may be used to create the outer profile shape and opening of the example sapphire component 310 described above with respect to FIG. 3.

In some embodiments, the edges of the sapphire component may be polished using a slurry or abrasive agent, such as a diamond slurry. The edges and/or surface of the sapphire component may also be ground, lapped, or subjected to another similar type of operations to shape the sapphire component. In some embodiments, the grinding, lapping, or other operations are performed to produce a surface that is substantially aligned with a crystallographic plane of the sapphire material. In some implementations, the initial slicing operations are performed to produce a surface that is substantially aligned with the crystallographic plane of the material. The surface may be within 1.0 degree of a crystallographic plane (e.g., the A-plane) of the sapphire material. The surface may deviate from a crystallographic plane of the sapphire component by an angle of 0.5 degrees or less. In other words, the surface may deviate from a crystallographic plane by less than 1.0 degree or by less than 0.5 degree.

The amount of misalignment between the surface and the crystallographic plane may have an impact on the visual appearance of the sapphire component post-heat treating. For example, in some cases annealing may cause a surface defect sometimes referred to as "haze" to form. Haze may appear as a rainbowing or oil-slick-like appearance on the outer surface of the sapphire component when a low angle reflection is observed. A haze may occur in localized areas or uniformly over the entire surface. The visual appearance of the haze may be the result of light interference occurring with light refracted through repeating terrace structures on the surface of the part. In some cases, the terrace structure results from the re-arrangement of the polished surface into an energetically favorable (lower) state with small or micro faces of the terrace aligned to a respective crystallographic plane. The re-arrangement is enabled by the surface atomic mobility that also enables the strengthening of parts and, thus, may not be easily avoided. In general, the formation of haze can be the crystallographic disorientation of the surface among other factors. Thus, controlling the alignment of the surface of the sapphire component with respect to the crystallographic structure may be an important factor in producing parts having a high optical quality.

In operation 1210, the sapphire component is polished. In some cases, the polishing operation uses a fine abrasive agent or media to produce a polished surface with a high-quality surface finish. For example, the surfaces of the sapphire component may be performed with a silica-based polishing medium. The polishing operation 1210 may result in a surface having a high quality surface finish that is substantially aligned with a crystallographic plane of the sapphire material. In some embodiments, the surface is within 1.0 degree or within 0.5 degrees of a crystallographic plane (e.g., the A-plane) of the sapphire material. As previously mentioned, having a surface that is substantially aligned with the crystallographic plane of the sapphire material may reduce the formation of white haze or other visual artifacts during a heat treating or annealing process.

In operation 1220, a first ultrasonic cleaning process is performed. In particular, the (one or more) polished surface(s) of the sapphire component may be cleaned using the first ultrasonic process. The first ultrasonic process may be configured to provide an initial cleaning after the polishing operation of 1210. The first ultrasonic process may be configured to remove coarse or large abrasive particles and other residue from the polished surface. The first ultrasonic cleaning process may, for example, be configured to remove particles that are greater than a first size (that may be greater in size than particles removed in subsequent cleaning operations). In general, the concentration of particles or contaminants will be greatest during the first cleaning operations (as comparted to subsequent cleaning operations).

With regard to operation 1220, the first ultrasonic cleaning process may use a first liquid immersion and a first ultrasonic frequency to remove particles and debris from the polished surface. For example, the first ultrasonic cleaning process may include submerging the sapphire component in a first liquid immersion having a first concentration of a detergent, cleaning agent, or etchant. The detergent or etchant may work in conjunction with sonic energy to dislodge or otherwise remove particles, debris, and residue from the polished surface. The ultrasonic energy may be produced by an ultrasonic transmission having a frequency ranging between 28 and 40 KHz. The ultrasonic transmission may include a sweep or step-wise function of ultrasonic frequencies. The ultrasonic transmission may include a pulsed energy transmission, a sustained energy transmission, or a mixture of pulsed and sustained energy transmissions.

In operation 1230, a second ultrasonic cleaning process is performed. In particular, one or more polished surfaces of the sapphire component may be cleaned using the second ultrasonic process. The second ultrasonic process may provide a more refined cleaning after the initial cleaning operation of 1220. For example, the second ultrasonic process may be configured to a portion of the remaining particles, contaminants, and/or residue that remain after operation 1220. The second ultrasonic cleaning process may be configured to remove particles that are greater than a second size but less than the first size (referenced above with respect to operation 1220). In addition, the second ultrasonic cleaning process may be configured to remove detergents and/or etchants used in operation 1220. The concentration of particles or contaminants in operation 1230 will generally be less than the concentration of particles or contaminants in operation 1220.

With regard to operation 1230, the second ultrasonic cleaning process may use a second liquid to immerse the sapphire component and a second ultrasonic frequency to remove particles and debris from the polished surface while the sapphire component is immersed. The second ultrasonic cleaning process may include submerging or immersing the sapphire component in the second liquid having a second concentration of a detergent, surfactant agent, or etchant that may be different than the first concentration used with respect to operation 1220. For example, the second liquid may be a substantially detergent-free, etchant-free, or substantially pure water solution used to perform a rinsing operation. In some cases, the second concentration of the detergent agent or etchant may be zero or substantially zero.

With regard to operation 1230, immersion in the second liquid may work in conjunction with sonic energy to dislodge or otherwise remove particles, debris, and residue from the polished surface. Similar to the previous example, the ultrasonic energy may be produced by an ultrasonic transmission having a frequency ranging between 28 and 40 KHz and may include a swept or stepped set of frequencies, a pulsed energy transmission, a sustained energy transmission, or a mixture of pulsed and sustained energy transmissions. In some embodiments, the second ultrasonic frequency (or set of frequencies) used in operation 1230 is different than the first ultrasonic frequency (or set of frequencies) used in operation 1220.

In some embodiments, the polished surface remains wet between the first ultrasonic cleaning process of operation 1220 and the second ultrasonic cleaning process of operation 1230. For example, the polished surface may not be allowed to dry partially or completely between the cleaning operations. This may be advantageous for multiple reasons. By keeping the polished surface wet between cleaning operations, any remaining particles or contaminants may be less likely to adhere to the polished surface. Dried or adhered particles may be more difficult to remove in subsequent cleaning operations. Additionally, by remaining wet between cleaning operations, any detergents, etchants, or cleaning agents may remain in solution, which may facilitate or enhance subsequent rinsing or cleaning operations performed on the polished surface.

Operations 1220 and 1230 and transfer of the sapphire component between the operations may be performed in a reduced-particle environment, such as a cleanroom. This may reduce the risk that additional contaminants will become deposited on the polished surface during the cleaning process 1200. In some embodiments, the polished surface is subjected to a deionization operation between the first and second ultrasonic cleaning processes of operations 1220 and 1230. The deionization operation may include introducing a charge or adding a deionizing agent or solution to one or both of the liquid immersions of operations 1220 and 1230. Additionally or alternatively, the deionization operation may include a separate, intermediate liquid immersion that includes introducing a charge or using a deionizing agent or solution to deionize particles on or near the wetted polished surface. In some embodiments, an air ionizer may be used and care may be taken to prevent or reduce the risk of drying the polished surface of the sapphire component during any air ionizing operation.

In operation 1240, a third ultrasonic cleaning process is performed. In particular, one or more polished surfaces of the sapphire component may be cleaned using the third ultrasonic process. The third ultrasonic process may provide an even more refined cleaning after the previous cleaning operations of 1220 and 1230. Operation 1240 may be performed as the next cleaning operation after operation 1230. Operation 1240 may also be performed after multiple, intermediate cleaning operations that follow operation 1230. In some embodiments, operation 1240 is the final cleaning operation after a series of three or more previous cleaning operations.

In some cases, the third ultrasonic process may remove a portion of the remaining particles, contaminants and/or residue that remain after any previous cleaning operations. The third ultrasonic cleaning process may, for example, remove particles that are less than either the first size or the second size (referenced above with respect to operations 1220 and 1230). In addition, the third ultrasonic cleaning process may remove detergents and/or etchants used in any previous cleaning operations.

With regard to operation 1240, the third ultrasonic cleaning process may use a third liquid to immerse the sapphire component and a third ultrasonic frequency to remove particles and debris from the polished surface while the sapphire component is immersed. In some embodiments, the third ultrasonic cleaning process may include submerging or immersing the sapphire component in a third liquid having a third concentration of a detergent, cleaning agent, or etchant that may be different than one or both of the first concentration used with respect to operation 1220 and the second concentration used with respect to operation 1230. For example, the third liquid may be a rinsing solution that includes, for example, a substantially detergent-free liquid, an etchant-free liquid, or is substantially comprised of pure water.

With regard to operation 1240, immersion in the third liquid may work in conjunction with sonic energy to dislodge or otherwise remove particles, debris, and residue from the polished surface. Similar to the previous example, the ultrasonic energy may be produced by an ultrasonic transmission having a frequency ranging between 28 and 40 KHz and may include a swept or stepped set of frequencies, a pulsed energy transmission, a sustained energy transmission, or a mixture of pulsed and sustained energy transmissions. In some embodiments, the second ultrasonic frequency (or set of frequencies) used in operation 1240 is different than the first and second ultrasonic frequencies (or sets of frequencies) used in operations 1220 and 1230.

In some embodiments, the polished surface remains wet between the first ultrasonic cleaning process of operation 1230 and the third ultrasonic cleaning process of operation 1240. As previously described, the polished surface may not be allowed to dry partially or completely between the cleaning operations, which may facilitate or enhance the effectiveness or overall quality of the cleaning process 1200. Additionally, the sapphire component may be subjected to one or more deionizing operations between cleanings, as discussed above. Additionally, the sapphire component may be subjected to one or more deionizing operations after cleaning and before heat treating or other subsequent operations.

While cleaning process 1200 is described above with respect to three discrete cleaning operations, variations of the above-described process may also be performed. For example, in some cases, only two of the cleaning operations (e.g., operations 1220 and 1230) may be performed without performing a third cleaning operation. Additionally, in some cases more than three cleaning operations may be performed. For example, four or more cleaning operations may be performed in accordance with process 1200. A first ultrasonic cleaning process may be performed by immersing in a first liquid having a detergent/etchant agent followed by a second ultrasonic cleaning operation having an immersion in a water bath (rinse). Subsequent ultrasonic cleaning operations may include an additional detergent or etchant-based immersion followed by one or more water-based (rinse) immersions.

Using process 1200, a sapphire component may be produced that is substantially free of particles or contaminants produced during a polishing or other manufacturing operation. As described previously, contaminants on a polished surface of a sapphire component may produce white dots, a haze, or other optical defect during a subsequent heat treating or annealing process. These optical defects may be difficult to remove without weakening the component by creating micro-cracks or other surface defects. Additionally, additional polishing or surface treatments may be costly and time-consuming.

The cleaning process 1200 may be well suited for use with the heat-treating processes described herein. In particular, the all-wet cleaning process of process 1200 may be combined with the vacuum and inert gas heat-treating process 1000 of FIG. 10 or the multi-stage heat-treating process 1100 of FIG. 11. Once the sapphire components have been cleaned in process 1200, they may be allowed to dry before being subjected to a heat-treating process. Additionally, the sapphire components may be placed in a shield enclosure or other container to prevent contamination before being subjected to a heat-treating process. In some embodiments, both the cleaning process 1200 and any subsequent heat-treating process(es) are performed in a cleanroom environment to prevent contamination of the sapphire components.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

We claim:

1. A system for heat treating sapphire components, the system including:
    a furnace defining an internal volume;
    a fixture positioned within the internal volume and having a rod that is configured to suspend multiple sapphire components;
    multiple shield elements that are configured to be interspersed with the multiple sapphire components within the internal volume;
    a vacuum supply operatively coupled to the internal volume and configured to remove gas from the internal volume of the furnace;
    a gas supply operatively coupled to the internal volume and configured to introduce and inert gas to the internal volume of the furnace; and
    a substantially tubular sleeve tool comprising an outer surface defining a bore therethrough:
    wherein the sleeve tool is configured to be inserted through an opening in multiple sapphire components that are to be heat treated, the sleeve tool is configured to receive the rod within the bore of the sleeve tool, and the sleeve tool is configured to deposit each of the multiple sapphire components that are to be heat treated onto the rod.

2. The system of claim 1, further comprising a fixture jig having a series of slot features, wherein:
    each slot feature is configured to hold upright a respective sapphire component of the multiple sapphire components that are to be heat treated; and
    the fixture jig is configured to maintain alignment of the openings of the multiple sapphire components that are to be heat treated during an insertion of the sleeve tool.

3. The system of claim 1, wherein the sleeve tool is formed from a material that is softer than the multiple sapphire components.

4. The system of claim 1, wherein each sapphire component that is to be heat treated is a cover sheet that is configured to be installed over a display of an electronic device.

* * * * *